United States Patent [19]

Takahashi et al.

[11] Patent Number: 5,035,975
[45] Date of Patent: Jul. 30, 1991

[54] LIGHT-SENSITIVE MATERIAL CONTAINING SILVER HALIDE REDUCING AGENT AND POLYMERIZABLE COMPOUND

[75] Inventors: Ryuichi Takahashi; Taku Nakamura, both of Kanagawa, Japan

[73] Assignee: Fuji Photo Film Co., Ltd., Kanagawa, Japan

[21] Appl. No.: 481,079

[22] Filed: Feb. 16, 1990

[30] Foreign Application Priority Data

Feb. 17, 1989 [JP] Japan .................................. 1-37782

[51] Int. Cl.$^5$ .............................................. G03C 1/72
[52] U.S. Cl. .................................... 430/138; 430/627; 430/629; 430/636; 264/4.32; 264/4.33; 264/4.7; 428/402.21; 428/402.22
[58] Field of Search ............... 430/138, 629, 636, 627; 264/4.32, 4.33, 4.7; 428/402.21, 402.22

[56] References Cited

U.S. PATENT DOCUMENTS

| | | | |
|---|---|---|---|
| 4,294,921 | 10/1981 | Yamaguchi et al. | 264/4.3 |
| 4,880,721 | 11/1989 | Ishikawa | 430/138 |
| 4,927,730 | 5/1990 | Sato | 430/138 |

FOREIGN PATENT DOCUMENTS

| | | |
|---|---|---|
| 188580 | 4/1987 | Japan . |
| 92686 | 4/1988 | Japan . |

*Primary Examiner*—Hoa Van Le
*Attorney, Agent, or Firm*—Sughrue, Mion, Zinn, Macpeak & Seas

[57] ABSTRACT

Disclosed is a light-sensitive material comprising a support and a light-sensitive layer provided thereon which contains silver halide, a reducing agent and an ethylenically unsaturated polymerizable compound. The silver halide and the polymerizable compound are contained in oily droplets. The oily droplets are a core material of microcupsules. The oily droplet has a film therearound which is composed of a reaction product of a water-soluble polymer having a sulfinyl group with an ethylenically unsaturated polymerizable compound.

9 Claims, No Drawings

LIGHT-SENSITIVE MATERIAL CONTAINING SILVER HALIDE REDUCING AGENT AND POLYMERIZABLE COMPOUND

FIELD OF THE INVENTION

The present invention relates to a light-sensitive material comprising a support and a light-sensitive layer provided thereon which contains silver halide, a reducing agent and an ethylenically unsaturated polymerizable compound.

BACKGROUND OF THE INVENTION

A light-sensitive material comprising a support and a light-sensitive layer containing silver halide, a reducing agent and a polymerizable compound is used in an image-forming method. The image-forming method comprises image-wise exposing to light the light-sensitive material to form a latent image of silver halide, and developing the light-sensitive material to imagewise polymerize the polymerizable compound by the action of the reducing agent.

Examples of the image-forming methods are described in Japanese Patent Publications No. 45(1970)-11149 (corresponding to U.S. Pat. No. 3,697,275), No. 47(1972)-20741 (corresponding to U.S. Pat. No. 3,687,667) and No. 49(1974)-10697, and Japanese Patent Provisional Publication No. 57(1982)-138632, No. 57(1982)-142638, No. 57(1982)-176033, No. 57(1982)-211146 (corresponding to U.S. Pat. No. 4,557,997), No. 58(1983)-107529 (corresponding to U.S. Pat. No. 4,560,637), No. 58(1983)-121031 (corresponding to U.S. Pat. No. 4,547,450) and No. 58(1983)-169143. In the image-forming method disclosed in the above-mentioned publications, when the exposed silver halide is developed using a developing solution, the polymerizable compound is induced to polymerize in the presence of a reducing agent to form a polymer image. Thus, this method needs a wet development process using a developing solution.

An improved image-forming method employing a dry process is described in Japanese Patent Provisional Publications No. 61(1986)-69062 and No. 61(1986)-73145 (the contents of both publications are described in U.S. Pat. No. 4,629,676 and European Patent Provisional Publication No. 0174634A2). In this image-forming method, a recording material (light-sensitive material) comprising a support and a light-sensitive layer provided thereon which contains a light-sensitive silver salt (silver halide), a reducing agent, a polymerizable compound and a binder is imagewise exposed to light to form a latent image, and then the material is heated to polymerize within the area where the latent image of the silver halide has been formed. The above-mentioned image-forming method using a dry process is also described in Japanese Patent Publications No. 61(1986)-183640 and No. 61(1986)-188535.

There is also known an image-forming method in which the polymerizable compound is polymerized within the area where a latent image of the silver halide has not been formed, as described in Japanese Patent Provisional Publication No. 61(1986)-260241. In this method, the polymerization of the polymerizable compound within the area where the latent image of the silver halide has been formed is inhibited, and simultaneously the polymerization of the polymerizable compound within other area (i.e., area where the latent image of the silver halide has not been formed) is accelerated.

The image-forming method using the light-sensitive material having the above constitution generally comprises the steps of forming imagewise a polymer compound on the light-sensitive material, superposing the light-sensitive material on an image-receiving material having an image-receiving layer, and pressing them to transfer the unpolymerized polymerizable compound on to the image-receiving material so as to obtain a transferred image on the image-receiving material. In this method, preferably employed is a light-sensitive material in which the silver halide and the polymerizable compound are contained in microcapsules (referred to hereinafter as "light-sensitive microcapsule(s)"), as described in Japanese Patent Provisional Publications No. 61(1986)-275742 and No. 61(1986)-278849.

As the shell material of the microcapsules, a variety of resins are known. For example, there are known polyamide resin and/or polyester resin as described in Japanese Patent Provisional Publication No. 62(1987)-209437, polyurea resin and/or polyurethane resin as described in Japanese Patent Provisional Publication No. 62(1987)-209438, amino-aldehyde resin as described in Japanese Patent Provisional Publication No. 62(1987)-209439, gelatin as described in Japanese Patent Provisional Publication No. 62(1987)-209440, epoxy resin as described in Japanese Patent Provisional Publication No. 62(1987)-209441, multi-layer shell of polyamide resin and/or polyurea resin as described in Japanese Patent Provisional Publication No. 62(1987)-209447, multi-layer shell of polyurethane resin and/or polyester resin as described in Japanese Patent Provisional Publications No. 62(1987)-209442 and No. 64(1989)-91131, melamine derivative-aldehyde resin as described in Japanese Patent Application No. 62(1987)-313486, and dual-walled microcapsules (inner shell: polyurea or polyurethane resin, outer shell: amino-aldehyde resin) as described in Japanese Patent Provisional Publication No. 63(1988)-269146.

In the preparation of microcapsules, various methods are utilized to prepare microcapsules which are more suitable for light-sensitive materials. For example, there are known a method of using a specific protective colloid (e.g., a mixture of pectin and a styrenesulfonic acid type polymer as described in Japanese Patent Provisional Publication No. 63(1988)-121837 and a mixture of gelatin and a styrenesulfonic acid type polymer as described in Japanese Patent provisional Publication No. 64(1989)-9439) and a method of removing a unnecessary component (i.e., component having buffer function, e.g., anionic protective colloid) remaining in a microcapsule dispersion after preparation of microcapsules as described in Japanese Patent Provisional Publication No. 63(1988)-173041.

A transferred image obtained by the above-mentioned image-forming method using the light-sensitive material having a light-sensitive layer which contains microcapsules is desired to have high contrast and high quality. However, the transferred image sometimes suffers various problems. For example, the density of the imaged portion (i.e., portion of maximum density) lowers or the portion other than the imaged portion (i.e., portion of background or portion of minimum density) is colored, and thereby the contrast of entire image is decreased. Otherwise, unevenness of the density occurs in the imaged portion even though the density in that portion should be uniform, such that the image quality deteriorates.

SUMMARY OF THE INVENTION

An object of the invention is to provide a light-sensitive material which provides an image of high contrast.

Particularly, the object of the invention is to provide a light-sensitive material which inhibits oozing of content (i.e., core material) of microcapsules in the heat (thermal) development stage so as to give an image of high contrast.

The present invention provides a light-sensitive material comprising a support and a light-sensitive layer provided thereon which contains silver halide, a reducing agent and an ethylenically unsaturated polymerizable compound, said silver halide and said polymerizable compound being contained in oily droplets which are a core material of microcapsules;

wherein the oily droplet has a film therearound which is composed of a reaction product of a water-soluble polymer having a sulfinyl group with an ethylenically unsaturated polymerizable compound, and inside and/or outside of the film of the oily droplet is formed a shell of the microcapsule which is a polymer wall of a high-molecular compound.

The present inventors have found that the above-mentioned reduction of the contrast of an image (i.e., lowering of density in the maximum density portion of the image or coloring of the minimum density portion of the image) takes place due to "oozing" of the core material (e.g., silver halide and polymerizable compound) from the microcapsule during the developing stage (particularly during the heat developing stage). In more detail, the unpolymerized polymerizable compound is transferred to an image-receiving material at a low level due to oozing of the content, and this low level of transferring of the unpolymerized polymerizable compound appears as the reduction of density in the image portion. In the minimum density portion of the image, on the other hand, the polymerizable compound oozed from the microcapsule is exposed to air to hinden polymerization, such that the polymerizable compound is poorly cured. This poor polymerization of the polymerizable compound appears as the coloring in the minimum density portion. It has been also found that the unevenness of the image density is markedly observed when the microcapsules have a wide diameter distribution or when the microcapsules are agglomerated with each other. In detail, when the microcapsules have a wide diameter distribution, they are ruptured at different levels of applied pressure even if the same polymerization reaction is brought about in the same light-exposure amount with respect to each microcapsule, that is, the microcapsule of small diameter is hardly ruptured but the microcapsule of large diameter is easily ruptured. As a result, unevenness of image density tends to occur in the transferred image, and such tendency is markedly observed when the microcapsules are agglomerated with each other.

In the microcapsule contained in the light-sensitive material of the invention, a thin film which is a reaction product of a sulfinyl group of the water-soluble polymer with an ethylenically unsaturated group contained in the core material (reaction product of Michael addition reaction) is formed around an oily droplet of the core material, and on the thin film is formed a shell of the microcapsule. In the preparation of the microcapsules, the water-soluble polymer having a sulfinyl group serves not only as a protective colloid but also to form the thin film around the oily droplet of the core material. The thin film of the reaction product inhibits coalescence of the oily droplets even when the droplets are brought into contact with each other, whereby droplets of larger diameters are hardly formed. Further, the sulfinyl acid which does not participate in the above reaction exists on the surface of the oily droplet to give anionic charge repulsion, and thereby the coalescence of the oily droplets can be also prevented. Accordingly, the oily droplets uniformly prepared as above can be efficiently encapsulated keeping individual state, to form microcapsules of high density. The water-soluble polymer having a sulfinyl group is effectively employed especially in the case of preparing microcapsules having a shell of amino-aldehyde resin.

As described above, the "oozing" is restrained by using the light-sensitive material of the present invention, so that an image of high contrast is obtained. Especially when a base precursor is contained in the core material for the purpose of acceleration of the development, the base precursor or a base released from the base precursor hardly oozes from the microcapsule in the developing stage, and hence the development is effectively accelerated by the base.

DETAILED DESCRIPTION OF THE INVENTION

The water-soluble polymer having a sulfinyl group for use in the invention has the formula (I):

$$-(A)_{\overline{x}}- \quad -(B)_{\overline{y}}- \qquad (I)$$

in which A is a repeated unit derived from an ethylenically unsaturated monomer having a sulfinyl group, B is a repeated unit derived from an ethylenically unsaturated monomer not having a sulfinyl group, and each of x and y indicates percentage by mol of each monomer, x is in the range of 0.1 to 100 mol %, y is in the rage of 0 to 99.9 mol %.

Examples of the ethylenically unsaturated monomers having a sulfinyl group include sodium vinylbenzenesulfinate, potassium vinylbenzenesulfinate, sodium N-acryloyl-N-methylaminobenzenesulfinate, sodium allylsulfinate and ammonium vinylbenzensulfinate. Preferably employed in the invention are sodium vinylbenzenesulfinate, potassium vinylbenzenesulfinate and ammonium vinylbenzenesulfinate.

Examples of the ethylenically unsaturated monomers not having a sulfinyl group include acrylic acid, salts thereof, methacrylic acid, salts thereof, acrylic esters, methacrylic esters, maleic monoesters, maleic diesters, itaconic monoesters, itaconic diesters, acrylamides, methacrylamides, N-vinyl compounds, styrene derivatives, and hetero rings having a vinyl group. Among them, preferred are acrylic esters, methacrylic esters, acrylamides, N-vinyl compounds and styrene derivatives.

Concrete examples of the acrylic esters include butyl acrylate, 2-ethylhexyl acrylate, hydroxyethyl acrylate and methoxyethoxy acrylate. Concrete examples of the methacrylic esters include methyl methacrylate, butyl methacrylate, hydroxyethyl methacrylate and benzyl methacrylate. Concrete examples of the acrylamides include acrylamide, N-acryloylmorpholine, N,N-dimethylacrylamide, 2-acrylamide-2-methylpropane sodium sulfonate, diacetone acrylamide and N-methylolacrylamide. Concrete examples of the N-vinyl compounds include N-vinylpyrrolidone, N-vinylsuccinimide and N-vinylacetamide. Concrete examples of the styrene derivatives include styrene, vinyltoluene, sodium vinylbenzenesulfonate and sodium vinylbenzenecarboxylate.
Examples of the water-soluble polymers having a sulfinyl group are preferably employed in the invention are as follows.
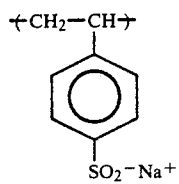 (P-1)
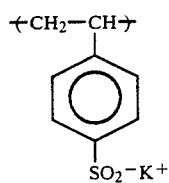 (P-2)
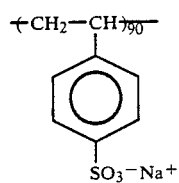 (P-3)
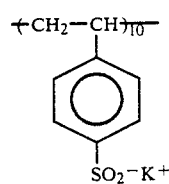 (P-4)
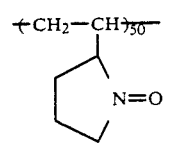 (P-5)
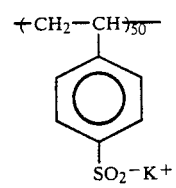
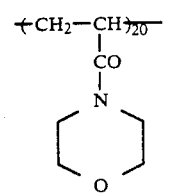
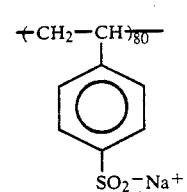
-continued
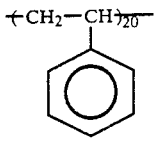 (P-6)
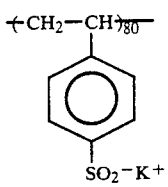
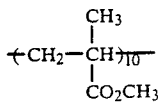 (P-7)
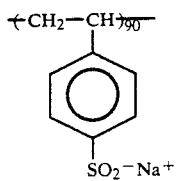
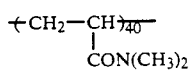 (P-8)
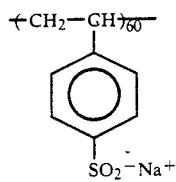
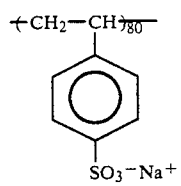 (P-9)
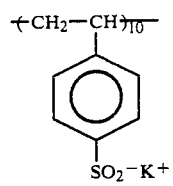
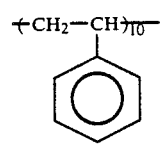
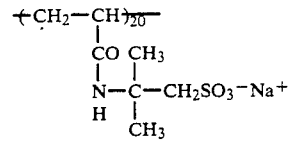 (P-10)

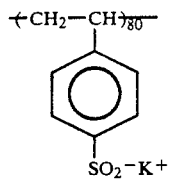

$$\text{+CH}_2\text{—CH)}_{80}\text{—}$$
$$\text{SO}_2\text{−K+}$$

The light-sensitive microcapsules contained in the light-sensitive material of the invention can be prepared by the process comprising a step (1) of dispersing a core material containing silver halide and a polymerizable compound having an ethylenically unsaturated group (i.e., hydrophobic material) in the form of oily droplets in an aqueous medium containing the above-mentioned water-soluble polymer having a sulfinyl group to give a dispersion, and a step (2) of forming a resin wall (i.e., shell) composed of a polymer on a thin film formed around the oily droplet. The core material may contain other optional components such as color image-forming substances.

The water-soluble polymers having a sulfinyl group can be employed singly or in combination of two or more kinds. Further, they can be employed in combination with other water-soluble polymers not having a sulfinyl group for the purpose of adjusting a viscosity of the aqueous medium or improving dispersibility of the hydrophobic material by utilization of its function as a protective colloid.

In the case of preparing a dispersion using only the water-soluble polymer having a sulfinyl group (two or more kinds of the polymers having a sulfinyl group may be included), the polymer is preferably employed in the form of an approx. 0.1–20% aqueous solution for the purpose of increasing a viscosity of the aqueous medium (aqueous phase). Therefore, the molecular weight of the polymer is preferably in the range of 20,000 to 2,000,000, more preferably in the range of 100,000 to 1,500,000. In this case (i.e., case of using only the water soluble polymer having a sulfinyl group), x in the formula (I) which indicates copolymerization ratio of the ethylenically unsaturated monomer having a sulfinyl group is preferably in the range of 0.1 to 50 mol %, more preferably in the range of 5 to 40 mol %.

In the case of preparing a dispersion using the water-soluble polymer having a sulfinyl group in combination with other water-soluble polymer not having a sulfinyl group, the water-soluble polymer having a sulfinyl group is preferably employed in the form of an approx. 0.01–10% aqueous solution, provided that the existence of the other water-soluble polymer not having a sulfinyl group contributes to the increase of viscosity of the aqueous medium and to the improvement of the dispersibility. In this case, accordingly, the molecular weight of the water-soluble polymer having a sulfinyl group can be made smaller than that in the above-mentioned case of using only the water-soluble polymer having a sulfinyl group. In other words, the molecular weight of the water-soluble polymer having a sulfinyl group in this case is preferably in the range of 5,000 to 1,000,000, more preferably in the range of 10,000 to 500,000. In this case, x in the formula (I) which indicates copolymerization ratio of the ethylenically unsaturated monomer having a sulfinyl group is preferably in the range of 10 to 100 mol %, more preferably in the range of 40 to 100 mol %.

In the above case (i.e., case of using both of the water-soluble polymer having a sulfinyl group and the water-soluble polymer not having a sulfinyl group), the ratio between the water-soluble polymer having a sulfinyl group and the water-soluble polymer not having a sulfinyl group is preferably in the range of 1:99 to 50:50, (water-soluble polymer having a sulfinyl group: water-soluble polymer not having a sulfinyl group, by weight), more preferably in the range of 2:98 to 20:80.

As the water-soluble polymer not having a sulfinyl group which can be employed in combination with the water-soluble polymer having a sulfinyl group, any of nonionic, anionic, cationic and ampholytic water-soluble polymers can be employed.

Examples of the nonionic water-soluble polymers include polyvinyl alcohol, polyvinyl pyrrolidone, polyacrylamide, polymethyl vinyl ether, polyacryloyl morpholine, polyhydroxyethyl acrylate, polyhydroxyethyl methacrylateacrylamide copolymer, hydroxyethyl cellulose, hydroxypropyl cellulose and methyl cellulose.

Examples of the anionic water-soluble polymers include sodium salts of sulfonated polystyrene, sodium salts of ethylene-maleic anhydride copolymer, isobutylene-maleic anhydride copolymer, sodium salts of methylvinyl ethermaleic anhydride, sodium salts of styrene-maleic anhydride, sodium polyacrylate, sodium polyvinylbenzenesulfonate, sodium polyacrylamide-2-methylpropanesulfonate, sodium polymethacrylate, sodium polyvinylbenzenesulfonate-styrene copolymer, sodium polyarylsulfonate, pectin, carboxymethyl cellulose and sodium alginate.

Examples of the cationic water-soluble polymers include poly-4-vinylpyridine hydrochloride, polyethyleneimine hydrochloride, polyarylamine hydrochloride, poly-N,N-diethylaminoethyl methacrylate hydrochloride and poly-N,N-diethylvinylbenzylamine sulfonate.

Examples of the ampholytic water-soluble polymers include gelatin.

The water-soluble polymer not having a sulfinyl group can be selected from the above-mentioned polymers depending on the kind of the shell material of the microcapsule. As the shell material, a melamine-formaldehyde resin obtained by in situ process or a urea-formaldehyde resin is advantageously employed in the invention, and in this case, preferably employed water-soluble polymers are nonionic water-soluble polymers not having an active hydrogen capable of reacting with formaldehyde or anionic water-soluble polymers. Most preferred are anionic water-soluble polymers.

The amount of the sulfinyl group of the water-soluble polymer contained in an aqueous medium is preferably in the range of 0,1 to 100 mol %, more preferably 0.5 to 20 mol %, based on the amount of the ethylenically unsaturated group of the polymerizable compound contained in the hydrophobic material.

The core material can contain a base precursor of salt type such as a base precursor (a) or a base precursor (b), (both are described hereinafter), for the purpose of acceleration of development, and in this case, the aqueous medium preferably contains both of a water-soluble polymer having a sulfinyl group and a nonionic water-soluble polymer. Generally, an anionic polymer is contained in the aqueous medium as a protective colloid, but in this case the base precursor is easily dissolved in the aqueous medium. However, when oily droplets are prepared by dispersing a core material containing such base precursor in an aqueous medium containing the above-mentioned combination of the water-soluble polymers, the base precursor is hardly dissolved in the aqueous medium and it can be firmly kept within the hydrophobic core material, whereby the base precursor or a base given by the base precursor does not ooze out of the microcapsules in the developing stage. Accordingly, even if a base precursor of salt type is contained in the core material, the base precursor is readily and firmly kept within the oily droplets (or within the microcapsules) and is prevented from oozing from the microcapsules in the developing stage by using the water-soluble polymer having a sulfinyl group in combination with the nonionic water-soluble polymer.

In the case of using the base precursor, the ratio between the water-soluble polymer having a sulfinyl group and the nonionic water-soluble polymer is preferably in the range of 5:95 to 30:70, (water-soluble polymer having a sulfinyl group: nonionic water-soluble polymer, by weight), more preferably 10:90 to 20:80.

As the base precursor of salt type, the following base precursors composed of salts of carboxylic acids and organic bases are preferably employed.

A base precursor (a) which is composed of a salt of a carboxylic acid and an organic base, wherein the organic base is a diacidic to tetraacidic base composed of two to four amidine moieties and a liking group for the amidine moieties, said amidine moiety corresponding to an atomic group formed by removing one or two hydrogen atoms from an amidine having the following formula (1):

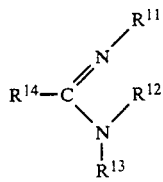

(1)

in which each of $R^{11}$, $R^{12}$, $R^{13}$ and $R^{14}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent groups, and any two of $R^{11}$, $R^{12}$, $R^{13}$ and $R^{14}$ may be combined together to form a five-membered or six-membered heterocyclic ring consisting of nitrogen and carbon atoms.

A base precursor (b) which is composed of a salt of a carboxylic acid and an organic base, wherein the organic base is a diacidic to tetraacidic base which is composed of two to four guanidine moieties and a liking group for the guanigine moieties, said guanidine moiety corresponding to an atomic group formed by removing one or two hydrogen atoms from a guanidine having the following formula (2):

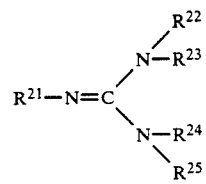

(2)

in which each of $R^{21}$, $R^{22}$, $R^{23}$, $R^{24}$ and $R^{25}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent groups, and any two of $R^{21}$, $R^{22}$, $R^{23}$, $R^{24}$ and $R^{25}$ may be combined together to form a five-membered or six-membered heterocyclic ring consisting of nitrogen and carbon atoms.

The above-mentioned base precursors (a) and (b) are described in detail in Japanese Patent Applications No. 62(1987)-188580 and No. 63(1988)-92686, respectively.

In the above-described process, around the oily droplet is formed a thin film composed of a reaction product of the water-soluble polymer having a sulfinyl group and the polymerizable compound having an ethylenically unsaturated group.

Then, the dispersion containing the oily droplets prepared as above is subjected to an encapsulation process to prepare microcapsules.

There is no specific limitation on the process for preparing microcapsules employable in the invention, and various known processes can be utilized.

Examples of the processes for preparing microcapsules include a process utilizing coacervation of hydrophilic wall-forming materials as described in U.S. Pat. No. 2,800,457 and No. 2,800,458; an interfacial polymerization process as described in U.S. Pat. No. 3,287,154, U.K. Patent No. 990,443 and Japanese Patent Publications No. 38(1963)-19574, No. 42(1967)-446 and No. 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyderesorcinol wall-forming materials as described in U.S. Pat. Nos. 4,001,140, 4,087,376 and 4,089,802; a process of using melamine-formaldehyde resins, hydroxypropyl cellulose or like wall-forming materials as described in U.S. Pat. No. 4,025,455; an in situ process utilizing polymerization of monomers as described in Japanese Patent Publication No. 36(1961)-9168 and Japanese Patent Provisional Publication No. 51(1976)-9079; a polymerization-dispersion cooling process as described in British Patent Nos., 927,807 and 965,074; and a spray-drying process as described in U.S. Pat. No. 3,111,407 and U.K. Patent No. 930,422.

A process for preparing microcapsules using the dispersion is generally carried out under heating at a temperature ranging from 40° to 90° C., and the oily droplets contained in the dispersion hardly coalesce with each other even under such heating, whereby the oily droplets can be kept in the initial shape and encapsulated easily to prepare microcapsules. This means that the shell of the microcapsule can be formed densely.

Formation of the shell on the thin film of the oily droplet means that the shell is formed on the inner side of the film of the oily droplet and/or on the outer side of the film of the oily droplet, and whether the shell is formed on the inner side and/or the outer side depends on the employed process for preparing microcapsules (encapsulation process). For example, an urea resin wall (shell) is formed on the inner side and the outer side of the film when the interfacial polymerization process is utilized. In the invention, the shell of the microcapsule, as described hereinbefore, is preferably formed on the outer side of the film of the oily droplet.

As the shell material of the microcapsule in the invention, an amino-aldehyde resin is preferred, and a melamine-formaldehyde resin is more preferred.

For the incorporation of the silver halide and the polymerizable compound having an ethylenically unsaturated group into the hydrophobic liquid for the preparation of the core material, the silver halide is generally incorporated first into an aqueous medium for the preparation of a silver halide emulsion and then the emulsion is mixed with a hydrophobic solvent. The aqueous medium of the silver halide emulsion moves at a later stage into an aqueous medium employed for the preparation of the microcapsules. Thus, there is brought about little water into the core of the obtained light-sensitive microcapsule. Simultaneously with the movement of water, silver halide grains move from the inside of the core material phase (oily phase) to the dispersing medium phase (aqueous phase), whereby not a small amount of silver halide grains gather in the vicinity of the interface between the core material phase and the dispersing medium phase. Accordingly, when the silver halide is incorporated into the core material in the form of a silver halide emulsion, the silver halide grains are apt to be present in the vicinity of the thin film of the oily droplet, between the thin film and the shell, or inside of the shell at high concentration. Such localized distribution of silver halide grains does not adversely effect the property of the light-sensitive microcapsule, and it is probable that such distribution preferably enhances the sensitivity.

The silver halide grains can be incorporated into the core material by methods other than the method of using a silver halide emulsion. For example, a dispersion obtained by dispersing silver halide grains in an organic solvent can be also utilized for the incorporation. Alternatively, a powdery silver halide can be simply mixed with the polymerizable compound.

The microcapsule dispersion prepared as above is then subjected to known separation processes such as evaporation of the aqueous medium, filtration or centrifugal separation, to obtain light-sensitive microcapsules.

The mean size of the microcapsules preferably ranges from 0.5 to 50 μm, more preferably 1 to 20 μm, most preferably 5 to 15 μm. Further, the microcapsules preferably have a homogeneous particle distribution as in the light-sensitive material described in Japanese Patent Provisional Publication No. 63(1988)-5334. The thickness of the shell of the microcapsule preferably is larger than a certain value against the particle diameter of the microcapsule as in the light-sensitive material described in Japanese Patent Provisional Publication No. 63(1988)-81336.

In the case of incorporating silver halide into the microcapsules, the average grain size of the silver halide preferably is not more than 1/5, more preferably not more than 1/10, of the average particle size of the microcapsules. When the average size of the silver halide grains is not more than 1/5 of the average particle size of the microcapsules, an even and uniform image can be obtained.

The light-sensitive material of the invention can be prepared using the light-sensitive microcapsules obtained as above. The components (reducing agent and the aforementioned or later-mentioned optional components) of the light-sensitive layer of the light-sensitive material may exist within the microcapsules or outside of the microcapsules. In the present invention, the reducing agent is preferably contained within the microcapsules. When the aforementioned base precursors (a) and (b) and the later-mentioned color image forming substances (optional components) are used, they are preferably contained within the microcapsules.

The silver halide, the reducing agent, the polymerizable compound and the support which constitute the light-sensitive material are described below in detail.

Examples of the silver halide employable for the light-sensitive material include silver chloride, silver bromide, silver iodide, silver chlorobromide, silver chloroiodide, silver iodobromide and silver chloroiodobromide in the form of grains.

The halogen composition of individual grains may be homogeneous or heterogeneous. The heterogeneous grains having a multi-layer structure in which the halogen composition varies from the outer surface portion (i.e., shell) to the inside portion (i.e., core) are described Japanese Patent Provisional Publication Nos. 57(1982)-154232, 58(1983)-108533, 59(1984)-48755 and 59(1984)-52237, U.S. Pat. No. 4,433,048, and European Patent No. 100,984. A silver halide grain having a core/shell structure in which the silver iodide content in the shell is higher than that in the core can be also employed as described in Japanese Patent Provisional Publication No. 62(1987)-183453.

There is no specific limitation on the crystal habit of silver halide grains. For example, a tubular grain having an aspect ratio of not less than 3 can be used as described in Japanese Patent Provisional Publication No. 62(1987)-210455.

It is preferred to use silver halide grains having a relatively low fogging value, as described in Japanese Patent Provisional Publication No. 63(1988)-68830.

Two or more kinds of silver halide grains which differ in halogen composition, crystal habit, grain size, and/or other features from each other can be employed in combination.

There is no specific limitation on the grain size distribution of silver halide grains. For example, silver halide grains having an almost uniform grain size distribution can be employed, as described in Japanese Patent Provisional Publication No. 62(1987)-210448.

The silver halide grains preferably have a mean grain (or particle) size of 0.001 to 5 μm, more preferably 0.001 to 2 μm.

The amount of the silver halide grains contained in the light-sensitive layer preferably is in the range of 0.1 mg/m$^2$ to 10 g/m$^2$ in terms of silver contained the silver halide and an organic silver salt which is one of optional components. The amount of the silver halide contained in the light-sensitive layer preferably is not more than 1 g/m$^2$, more preferably in the range of 1 to 500 mg/m$^2$, in terms of silver only contained in the silver halide.

The reducing agent employable in the light-sensitive material has a function of reducing the silver halide and/or a function of accelerating or restraining polymerization of the polymerizable compound. There are known various reducing agents having the above-mentioned function. Examples of such reducing agents include hydroquinone, catechol, p-aminophenol, p-phenylenediamine, 3-pyrazolidone, 3-aminopyrazole, 4-amino-5-pyrazolone, 5-aminouracil, 4,5-dihydroxy-6-aminopyrimidine, reductone, aminoreductone, o- or p-sulfonamidophenol, o- or p-sulfonamidonaphthol, 2-sulfonamidoindanone, 4-sulfonamido-5-pyrazolone, 3-sulfonamidoindole, sulfonamidopyrazolobenzimidazole, sulfonamidopyrazolotriazole, α-sulfonamidoketone and hydrazine.

By adjusting the kind, amount, etc. of the above reducing agent, the polymerizable compound can be polymerized within the area where a latent image of the silver halide has been formed or the area where a latent image of the silver halide has not been formed. In the case that the polymerizable compound is polymerized within the area where the latent image of the silver halide has not been formed, preferably employed as the reducing agent is 1-phenyl-3-pyrazolidone.

Various reducing agents having the above-mentioned functions (including compounds referred to as developing agent, hydrazine derivative) are described in Japanese Patent Provisional Publications 61(1986)-183640, No. 61(1986)-183545, No. 61(1986)-228441, No. 62(1987)-70836, No. 61(1987)-86354, No. 62(1987)-86355, No. 62(1987)-198849, and Japanese Patent Application No. 60(1985)-227528. These reducing agents are also described in T. James, "The Theory of the Photographic Process", 4th edition, pp. 291-334 (1977), Research Disclosure Vol. 170, No. 17029, pp. 9-15 (June 1978), and Research Disclosure Vol. 176, No. 17643, pp. 22-31 (December 1978). Further, there can be also employed a reducing agent precursor capable of releasing a reducing agent under heating or in contact with a base. In the light-sensitive material used in the invention, various reducing agents and reducing agent precursors described in the above publications, applications and literatures can be effectively employed. Thus, "the reducing agent(s)" in the present specification includes all of the reducing agents and reducing agent precursors described in the above publications, etc.

These reducing agents can be used singly or in combination. In the case that two or more reducing agents are used in combination, certain interactions between there reducing agents may be expected. One of the interactions is for acceleration of reduction of silver halide (and/or an organic silver salt) through so-called superadditivity. Another interaction is a chain reaction in which an oxidized state of one reducing agent formed by a reduction of silver halide (and/or an organic silver salt) induces or inhibits the polymerization of the polymerizable compound via oxidation-reduction reaction with another reducing agent. Both interactions may occur simultaneously. Thus, it is difficult to determine which of the interactions has occurred in practical use.

Concrete examples of the above-mentioned reducing agents include pentadecylhydroquinone, 5-t-butylcatechol, p-(N,N-diethylamino)phenol, 1-phenyl-4-methyl-4-hydoroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphthol and 2-(N-methyl-N-octadecylcarbamoyl)-4-sulfonylaminonaphthol, 1-acetyl-2-phenylhydrazine, 1-acetyl-2-{(p- or)o-aminophenyl}hydrazine, 1-formyl-2-{(p- or o)-aminophenyl}hydrazine, 1-acetyl-2-{(p- or o)-methoxy-phenyl}hydrazine, 1-lauroyl-2-{(p- or o-) aminophenyl}hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)butyloyl}-2-(p- or o-aminophenyl)hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]-hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)butylamide}phenyl]-hydrazine, 1-acetyl-2-[4-{2-(2,4-di-tert-pentylphenoxy)-butylamido}-phenyl]hydrazine, 1-trityl-2-[{2,6-dichloro-4-(N,N-di-2-ethylhexyl)carbamoyl}phenyl]-hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}-phenyl]-hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on 1 mole of silver (including the above-mentioned silver halide and the optional organic silver salt).

There is no specific limitation with respect to the polymerizable compound, except that the compound has to have an ethylenic unsaturated bond. Polymerizable liquid compounds having a relatively high boiling point (e.g., 80° C. or higher) that are hardly evaporated upon heating are preferably employed. In the case that the light-sensitive layer contains a color image-forming substance (optional component, described later), the polymerizable compounds are preferably cross-linkable compounds having plural polymerizable groups in the molecule, because such cross-linkable compounds favorably serve for fixing the color image-forming substance in the course of polymerization-hardening of the polymerizable compounds.

The ethylenically unsaturated polymerizable compounds employable in the light-sensitive material are described in the aforementioned or later-mentioned publications concerning light-sensitive materials.

Examples of the compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic acid esters, itaconic acid esters, styrene, styrene derivatives, vinyl ethers, vinyl esters, N-vinyl heterocyclic compounds, allyl ethers, allyl esters, and derivatives thereof.

Concrete examples of the acrylic esters include n-butyl acrylate, cyclohexyl acrylate, 2-ethylhexyl acrylate, benzyl acrylate, furfuryl acrylate, ethoxyethoxyethyl acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, dipentaerythritol hexacrylate, diacrylate of polyoxyethylenated bisphenol A, diacrylate of 2,2-dimethyl-3-hydroxypropane aldehyde and trimethylolpropane condensate, triacrylate of 2,2-dimethyl-3-hydroxypropionaldehyde and pentaerythritol condensate, polyacrylate of hydroxypolyether, polyester acrylate and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. The light-sensitive material containing a mixture of two or more polymerizable compounds is described in Japanese Patent Provisional Publication No. 62(1987)-210445. Further, compounds formed by bonding a polymerizable group such as a vinyl group or a vinylidene group to a reducing agent are also employed as the polymerizable compounds. The light-sensitive materials using compounds which function as both the reducing agent and the polymerizable compound or both the color image-forming substance and the polymerizable compound are included in embodiments of the light-sensitive material employable in the invention.

The amount of the polymerizable compound to be contained in the light-sensitive layer preferably ranges from 5 to 120,000 parts by weight, and more preferably from 12 to 12,000 parts by weight, per one part by weight of the silver halide.

The light-sensitive material can be prepared by arranging a light-sensitive layer containing the above-mentioned components on a support. There is no specific limitation with respect to the support. In the case that heat development is utilized in the use of the light-sensitive material, a material for the support preferably is resistant to heat given in the developing stage. Examples of the material employable for the preparation of the support include glass, paper, fine paper, coat paper, cast-coat paper, synthetic paper, metals and analogues thereof, films of polyester, acetyl cellulose, cellulose ester, polyvinyl acetal, polystyrene, polycarbonate and polyethylene terephthalate, and paper laminated with resin or polymer (e.g., polyethylene).

In the case that a porous material such as paper is employed as the support, the porous support preferably has a certain smoothness as described in Japanese Patent Provisional Publication No. 62(1987)-209529. As the paper support, there can be employed various paper supports such as a paper support having a low water absorption described in Japanese Patent Provisional Publication No. 63(1988)-38934; a paper support having a certain Bekk Smoothness described in Japanese Patent Provisional Publication No. 63(1988)-47754, a paper support having a low shrinkage ratio described in Japanese Patent Provisional Publication No. 63(1988)-81339; a paper support having a low permeation rate described in Japanese Patent Provisional Publication No. 63(1988)-81340, and a paper support having a pH value of 5 to 9 described in Japanese Patent Provisional Publication No. 673(1988)-97941.

Various embodiments of the light-sensitive materials, optional components which may be contained in the light-sensitive layer, and auxiliary layers which may be optionally arranged on the light-sensitive layer are described below.

Examples of the optional components which may be contained in the light-sensitive layer include color image-forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, dyes decolored by irradiation with light, matting agents, antismudging agents, plasticizers, water releasers, binders, photopolymerization initiators, solvents of the polymerizable compound, and water soluble vinyl polymers.

In the light-sensitive material, a polymer image can be obtained on the light-sensitive layer having the above-mentioned constitution. Further, a color image can be obtained on the light-sensitive layer by incorporating a color image-forming substance as an optional component into the light-sensitive layer.

There is no specific limitation with respect to the color image-forming substance, and various kinds of substances can be employed. Examples of the color image-forming substance include colored substances (i.e., dyes and pigments) and non-colored or almost non-colored substances (i.e., color former or dye- or pigment-precursor) which develop to give a color under application of external energy (e.g., heating, pressing, light irradiation, etc.) or by contact with other components (i.e., developer). Light-sensitive materials using the color image-forming substance are described in Japanese Patent Provisional Publication No. 61(1986)-73145. Light-sensitive materials using a dye or pigment as the color image-forming substance are described in Japanese Patent Provisional Publication No. 62(1987)-187346. Light-sensitive materials using a leuco dye are described in Japanese Patent Provisional Publication No. 62(1987)-209436. Light-sensitive materials using a triazene compound are described in Japanese Patent Provisional Publication No. 62(1987)-251741. Light-sensitive materials using a leuco dye which gives a yellow color are described in Japanese Patent Provisional Publication Nos. 62(1987)-288827 and 62(1987)-288828. Light-sensitive materials using a leuco dye which gives a cyan color are described in Japanese Patent Provisional Publication No. 63(1988)-53542. Examples of dyes and pigments (i.e., colored substance) employable in the invention include commercially available ones as well as various known compounds described in the technical publications, for example, Yuki Gosei Kagaku Kyokai (ed.), "Handbook of Dyes (in Japanese, 1970)" and Nippon Ganryo Gijutsu Kyokai (ed.,), "New Handbook of pigments (in Japanese, 1977)". Those dyes and pigments can be used in the form of a solution or dispersion.

Examples of the substances which develop to give a color by application of energy include thermochromic compounds, piezochromic compounds, photochromic compounds and leuco compounds derived from triarylmethane dyes, quinone dyes, indigoid dyes, azine dyes, etc. Those compounds can develop to give a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of color formation systems are described in Hiroyuki Moriga, "Introduction of Chemistry of Speciality Paper (in Japanese, 1975)", pp. 29–58 (pressure-sensitive copying paper, pp. 87–95 (azography), pp. 118–120 (heat-sensitive color formation by chemical change) or in MSS. of the seminar promoted by the Society of Kinki Chemical Industry, "The Newest Chemistry of Coloring Matter-Attractive Application and New Development as a Functional Coloring Matter", pp. 26–32 (June 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image-forming substance is preferably used in an amount of 0.5 to 50 parts by weight, more preferably 2 to 30 parts by weight, per 100 parts by weight of the polymerizable compound. In the case that the developer is employed, the amount of the developer is preferably in the range of approx. 0.3 to 80 parts by weight per one part by weight of the color former.

In the case of using two kinds of color image forming substances which give a color when they are brought into contact with each other (e.g., color former and a developer), one substance and the polymerizable compound are contained in the microcapsule, and the other is arranged outside of the microcapsule in the light-sensitive layer, whereby a color image can be formed on the light-sensitive layer. The light-sensitive material in which a color image can be obtained without using an image-receiving material as described above is described in Japanese Patent Provisional Publication No. 62(1987)-209444.

There is no specific limitation with respect to the nature of the sensitizing dye, and any known sensitizing dyes used in the conventional photographic art may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from approx. $10^{-8}$ to $10^{-2}$ mole per 1 mole of the silver halide.

The sensitizing dye is preferably introduced in the stage of the preparation of the silver halide emulsion. The sensitizing dye can be introduced in the stage of the preparation of the silver halide grains as described in Japanese Patent Provisional Publication No. 62(1987)-947. The sensitizing dye can be also introduced in the stage of the preparation of the silver halide emulsion after preparing the silver halide grains as described in Japanese Patent Provisional Publication No. 62(1987)-210449. Concrete examples of the sensitizing dyes are described in Japanese Patent Provisional Publication Nos. 62(1987)-947 and 62(1987)-210449. The sensitizing dye having a sensitivity within the infrared region can be also employed in combination as described in Japanese Patent Provisional Publication No. 63(1988)-184738.

Addition of an organic silver salt to the light-sensitive material is particularly effective for the heat development. The reason is assumed that the organic silver salt takes part in a redox reaction using a silver halide latent image as a catalyst when heated to a temperature of 80° C. or higher. In such case, the organic silver salt is preferably positioned in contact with the silver halide or closely to the silver halide. Examples of the organic compounds employable for forming such organic silver salt include aliphatic or aromatic carboxylic acids, thiocarbonyl group-containing compounds having a mercapto group or an α-hydrogen atom, and imino group-containing compounds. Particularly preferred is benzotriazole. The organic silver salt is generally used in an amount of from 0.01 to 10 mole, preferably from 0.01 to 1 mole, per 1 mole of the silver halide. Instead of the organic silver salt, an organic compound (e.g., benzotriazole) which can form an organic silver salt in combination with an inorganic silver salt can be incorporated into the light-sensitive layer to obtain the same effect. The light-sensitive material using the organic silver salt is described in Japanese Patent Provisional Publication No. 62(1987)-3246. The above-mentioned organic silver salt is preferably used in an amount of 0.1 to 10 moles, more preferably 0.01 to 1 mole, per 1 mole of the silver halide.

A radical generator which takes part in acceleration (or inhibition) of polymerization by the reducing agent may be contained in the light-sensitive layer. A light-sensitive material using triazene silver as the radical generator is described in Japanese Patent Provisional Publication No. 62(1987)-195639. A light-sensitive material using a silver diazotate as the radical generator is described in Japanese Patent Provisional Publication No. 62(1987)-195640. A light-sensitive material using an azo compound as the radical generator is described in Japanese Patent Provisional Publication No. 62(1987)-195641.

Various image formation accelerators are employable in the light-sensitive material. The image formation accelerators accelerates the oxidation-reduction reaction between a silver halide (and/or an organic silver salt) and a reducing agent, accelerate diffusion of an image forming substance from a light-sensitive layer to the image-receiving layer of the image-receiving material (described hereinafter), or provide a similar function. The image formation accelerators can be classified into inorganic bases, organic bases, base precursors (excluding base precursors composed of salts of organic bases described in the aforementioned Japanese Patent Applications No. 62(1987)-188580 and No. 63(1988)-92686)), oils, surface active agents, compounds functioning as an anti-fogging agent and/or a development accelerator, hot-melt solvents, compounds functioning as antioxidants, and the like, from the viewpoint of physicochemical functions. These groups, however, generally have certain combined functions, that is, two or more of the above-mentioned effects, so that the above classification is for the sake of convenience, and one compound often has a plurality of functions combined.

Examples of the image formation accelerators are given below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent; ammonium hydroxide; hydroxides of quaternary alkylammoniums; and hydroxides of other metals. Preferred examples of the organic bases include aliphatic amines (e.g., trialkylamines, hydroxylamine and aliphatic polyamines); aromatic amines (e.g., N-alkyl-substituted aromatic amines, N-hydroxylalkyl-substituted aromatic amines and bis[p-(dialkylamino)-phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts of bases with organic acids capable of undergoing decarboxylation by heating, compounds capable of releasing amines through intramolecular nucleophilic substitution, Lossen rearrangement, or Beckmann rearrangement, and the like; and those capable of releasing a base by electrolysis. Examples of the base precursors include guanidine trichloroacetate, piperidine trichloroacetate, morpholine trichloroacetate, p-toluidine trichloroacetate, 2-picoline trichloroacetate, guanidine phenylsulfonyl-acetate, guanidine 4-chlorophenylsulfonylacetate, guanidine 4-methylsulfonylphenylsulfonylacetate, and guanidine 4-acetylaminomethyl propionate.

The bases or the base precursors can be employed in an amount within a wide range in the light-sensitive material. The base or base precursor is preferably employed in an amount of not more than 100% by weight, more preferably from 0.1 to 40% by weight, based on the total solid content of the light-sensitive layer. These bases or base precursors can be used singly or in combination.

The light-sensitive material employing the base or base precursors is described in Japanese Patent Provisional Publication No. 62(1987)-264041. A light-sensitive material employing a tertiary amine as the base or base precursor is described in Japanese Patent Provisional Publication No. 62(1987)-170954. A light-sensitive material employing dispersed grains of hydrophobic base compound having a melting point of 80° C. to 180° C. is described in Japanese Patent Provisional Publication No. 62(1987)-209523. A light-sensitive material employing guanidine derivatives having a solubility of not more than 0.1% is described in Japanese Patent Provisional Publication No. 62(1987)-215637. A light-sensitive material employing hydroxydes of alkali metals or alkaline earth metals or salt is described in Japanese Patent Provisional Publication No. 62(1987)-209448.

A light-sensitive material employing acetylide compounds as the base precursor is described in Japanese Patent Provisional Publication No. 63(1988)-24242. A light-sensitive material employing salts of propiolic acid as the base precursor and further containing silver, copper, silver compound or copper compound as the catalyst of the base production reaction is described in Japanese Patent Provisional Publication No. 63(1988)-46446. A light-sensitive material containing the salts of propiolic acid under the condition of being separated from the silver, copper, silver compound or copper compound is described in Japanese Patent Provisional Publication No. 63(1988)-81338. A light-sensitive material containing free ligands in addition to the salts of propiolic acid and the silver, copper, silver compound or copper compound is described in Japanese Patent Provisional Publication No. 63(1988)-97942. A light-sensitive material employing salts of the propiolic acid as the base precursor and further containing heat fusible compounds as the accelerator of the base production reaction is described in Japanese Patent Provisional Publication No. 63(1988)-46447. A light-sensitive material employing a salt of sulfonyl acetate as the base precursor and further containing heat fusible compound as the accelerator for the base production reaction is described in Japanese Patent Provisional Publication No. 63(1988)-48543. A light-sensitive material employing compounds in which isocyanate or isothiocyanate is bonded to an organic base is described in Japanese Patent Provisional Publication No. 63(1988)-24242.

In the case of using the base or the base precursor in the light-sensitive material, it is preferred that the silver halide, the reducing agent and the polymerizable compound are contained in the aforementioned microcapsules, and the base or base precursor is arranged outside of the microcapsule in the light-sensitive layer. Otherwise, the base or base precursor can be contained in different microcapsules from those containing the polymerizable compound as described in Japanese Patent Provisional Publication No. 62(1987)-209521. The base or base precursor can be contained in the microcapsules under the condition that the base or base precursor is dissolved or dispersed in an aqueous solution of a water retention agent as described in Japanese Patent Provisional Publication No. 62(1987)-209522, or under the condition that the base or base precursor is adsorbed on solid particles as described in Japanese Patent Provisional Publication No. 62(1987)-209526. The base or base precursor contained in the microcapsules preferably has a melting point in the range of 70° to 210° C. as described in Japanese Patent Provisional Publication No. 63(1988)-65437. Further, the base or base precursor can be dissolved in grains in combination with hydrophobic substance as described in Japanese Patent Provisional Publication No. 63(1988)-97943.

For acceleration of the development, the base or the base precursor can be contained within the microcapsule together with the silver halide, the reducing agent and the polymerizable compound, as described in Japanese Patent Applications No. 62(1987)-188580, No. 62(1987)-313482 and No. 63(1988)-92686. In this case, preferably used are the base precursors described in Japanese Patent Applications No. 62(1987)-150973 and No. 62(1987)-226134.

The base or base precursor can be contained in a layer different from the light-sensitive layer as described in Japanese Patent Provisional Publication No. 62(1987)-253140. The layer containing a base or base precursor will be described hereinafter. Further, the base or base precursor may be contained in the aforementioned porous support as described in Japanese Patent Provisional Publication No. 63(1988)-32546.

Examples of the oils employable in the invention include high-boiling organic solvents which are used as solvents for emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an anti-fogging agent and/or a development accelerator can be used to give an image of high sharpness having a high maximum density and a low minimum density (i.e., an image having high S/N ratio). Examples of the compounds functioning as an anti-fogging agent and/or a development accelerator include conventional anti-fogging agent described in Japanese Patent Provisional Publication No. 62(1987)-151838; a compound having a cyclic amido structure described in Japanese Patent Provisional Publication No. 61(1986)-151841; a thioether compound described in Japanese Patent Provisional Publication No. 62(1987)-151842; a polyethylene glycol derivative described in Japanese Patent Provisional Publication No. 62(1987)-151843; a thiol derivative described in Japanese Patent Provisional Publication No. 62(1987)-151844; an acetylene compound described in Japanese Patent Provisional Publication No. 62(1987)-178232; a sulfonamide derivative described in Japanese Patent Provisional Publication No. 62(1987)-183450; and a salt of quaternary ammonium ion described in Japanese Patent Provisional Publication No. 63(1988)-91653.

The hot-melt solvent preferably is a compound which may be used as a solvent of the reducing agent or one which has high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having a $SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure pp. 26–28 (December 1976). A light-sensitive material employing the hot-melt solvent is described in Japanese Patent Provisional Publication No. 62(1987)-86355.

The compounds functioning as an antioxidant can be employed for the purpose of eliminating the oxygen influence (oxygen functions as a polymerization inhibitor). An example of the compound functioning as an antioxidant is a compound having two or more mercapto groups as described in Japanese Patent Provisional Publication No. 62(1987)-209443.

The thermal polymerization initiators employable in the light-sensitive material are compounds which are decomposed under heating to generate a polymerization initiating species, particularly a radical, and those generally employed as an initiator of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide; inorganic peroxides, e.g., hydrogen peroxide, potassium persulfate, and ammonium persulfate; and sodium p-toluenesulfinate. The thermal polymerization initiator is preferably used in an amount of from 0.1 to 120% by weight, more preferably from 1 to 10% by weight, based on the amount of the polymerizable compound. In a system in which the polymerizable compound within the area where the latent image has not been formed is polymerized, the thermal polymerization initiator or a photopolymerization initiator (described later) is preferably incorporated into the light-sensitive layer. The light-sensitive material using the thermal polymerization initiators is described in Japanese Patent Provisional Publication No. 62(1987)-70836.

The development stopping agents employable in the light-sensitive material are compounds which neutralize a base or react with a base to reduce the base concentration in the layer to hereby stop development, or compounds that mutually react with silver or a silver salt to suppress development. More specifically, examples of the developement stopping agents include acid precursors which release acids upon heating, electrophilic compounds which undergo substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

Dyes or pigments can be contained in the light-sensitive layer for the purpose of anti-halation or anti-irradiation. Further, white pigments can be contained in the light-sensitive layer for the same purpose as described in Japanese Patent Provisional Publication No. 63(1988)-29748.

In the case that the light-sensitive layer of the light-sensitive material contains the aforementioned microcapsules, dyes having a property of being decolorized when they are heated or irradiated with light can be contained in the microcapsules. The dyes having such property serves as a yellow filter in a conventional silver salt photographic system. The light-sensitive materials using the dyes having a property of being decolorized when heated or irradiated with light are described in Japanese Patent Provisional Publication No. 63(1988)-97940.

The antismudging agents employable in the light-sensitive material preferably are in the form of particles which are solid at ambient temperatures. Examples of the anti-smudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 μm, more preferably 5 to 40 μm. The size of the particle is preferably larger than that of the microcapsule.

The binder employable in the light-sensitive material can be contained in the light-sensitive layer singly or in combination. The binder preferably is a hydrophilic binder, and representative hydrophilic binders are transparent or semi-transparent binders. Examples of the binders include natural substances, such as gelatin, gelatin derivatives, cellulose derivatives, starch, and gum arabic; and synthetic polymeric substances, such as water-soluble polyvinyl compounds, e.g., polyvinyl alcohol, polyvinyl pyrrolidone, and acrylamide polymers. In addition to the synthetic polymeric substances, vinyl compounds dispersed in the form of latex, which are particularly effective to increase dimensional stability of photographic materials, can be also used. The light-sensitive material using the binder is described in Japanese Patent Provisional Publication No. 61(1986)-69062. The light-sensitive material using both of the binder and the microcapsules is described in Japanese Patent Provisional Publication No. 62(1987)-209525.

A photopolymerization initiator can be contained in the light-sensitive layer of the light-sensitive material for the purpose of polymerization of the transferred unpolymerized polymerizable compound, as described in Japanese Patent Provisional Publication No. 62(1987)-161149. The photopolymerization initiator can be used in a system in which the polymerizable compound is polymerized in the portion where a latent image of a silver halide is not formed as well as the aforementioned thermal polymerization initiator.

In the case of using a solvent for the polymerizable compound, the solvent is preferably contained in a microcapsule which is different from the microcapsule containing the polymerizable compound. The light-sensitive material employing a polymerizable compound contained in a microcapsule and a blending organic solvent is described in Japanese Patent Provisional Publication No. 62(1987)-209524.

A water soluble vinyl polymer can be adsorbed on the aforementioned silver halide grains. The light-sensitive material employing the water soluble vinyl polymer is described in Japanese Patent Provisional Publication No. 63(1988)-91652.

Examples and usage of components others than the above-mentioned ones which are optionally contained in the light-sensitive layer are also described in the above-mentioned publications concerning the light-sensitive material, and in Research Disclosure Vol. 170, No. 17029, pp. 9-15 (June 1978).

The light-sensitive layer of the light-sensitive material comprising the above-mentioned components preferably has a pH value of not more than 7 as described in Japanese Patent Provisional Publication No. 62(1987)-275235.

Examples of auxiliary layers which are optionally arranged on the light-sensitive layer include a heating layer, an antistatic layer, an anti-curling layer, a peel layer, a cover sheet, a protective layer, a layer containing a base or a base precursor, a base barrier layer and an anti-halation layer (colored layer).

Instead of using an image-receiving material (described later), the above-mentioned image-receiving layer can be provided on the light-sensitive material to form an image on the image-receiving layer. The structure of the image-receiving layer provided on the light-sensitive material can be the same as that of the image-receiving material.

A light-sensitive material using a heating layer is described in Japanese Patent Provisional Publication No. 61(1986)-294434. A light-sensitive material provided with a cover sheet or a protective layer is described in Japanese Patent Provisional Publication No. 62(1987)-210447. A light-sensitive material provided a layer containing a base or base precursor is described in Japanese Patent Provisional Publication No. 62(1987)-253140. A light-sensitive material provided with a colored layer as the anti-halation layer is described in Japanese Patent Provisional Publication No. 63(1988)-101842. A light-sensitive material provided with a base barrier layer is described in Japanese Patent Provisional Publication No. 62(1987)-253140. Examples of other auxiliary layers and usage thereof are described in the above-mentioned publications concerning the light-sensitive materials.

The process for the preparation of a light-sensitive material is described below.

Various processes can be employed for preparing a light-sensitive material. In a generally known process, a light-sensitive material is prepared by dissolving, emulsifying or dispersing each of the components of the light-sensitive layer in an adequate solvent to obtain a coating solution (including the aforementioned light-sensitive microcapsule dispersion), then applying the solution onto the aforementioned support, and drying the coated layer of the solution.

The coating solution is generally obtained by preparing liquid compositions, each composition containing each component, and mixing those compositions with each other. Each of the liquid compositions may contain plural components. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Processes for the preparation of the liquid composition and the coating solution are described below.

The silver halide emulsion can be prepared by any known processes such as an acid process, a neutral process or an ammonia process.

In the stage for the preparation, a soluble silver salt and a soluble halogen salt can be reacted in accordance with a single jet process, a double jet process or a combination thereof. A reverse mixing method in which grains are formed in the presence of excess silver ions, or a controlled double jet process in which a pAg value is maintained constant, can be also employed. In order to accelerate grain growth, the concentrations or amounts of the silver salt and halogen salt to be added or the rate of their addition can be increased as described in Japanese Patent Provisional Publications Nos. 55(1980)-158124 and 55(1980)-158124 and U.S. Pat. No. 3,650,757.

The silver halide emulsion employable for the preparation of the light-sensitive material may be of a surface latent image type that forms a latent image predominantly on the surface of silver halide grains, or of an inner latent image type that forms a latent image predominantly in the inside of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Provisional Publication No. 58(1983)-3534 and Japanese Patent Publication No. 58(1983)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsion, various hydrophilic colloids are advantageously used as protective colloids. Examples of employable hydrophilic colloids include proteins (e.g., gelatin, gelatin derivatives, gelatin grafted with other polymers, albumin and casein), cellulose derivatives (e.g., hydroxyethyl cellulose and cellulose sulfate), saccharide derivatives (e.g., sodium alginate and starch derivative), and a wide variety of synthetic hydrophilic polymers, such as polyvinyl alcohol, partially acetalized polyvinyl alcohol, poly-N-vinylpyrrolidone, polyacrylic acid, polymethacrylic acid, polyacrylamide, polyvinylimidazole, and polyvinylpyrazole and copolymers comprising monomers constituting these homopolymers. Among them, gelatin is most preferred. Examples of the employable gelatin include not only limetreated gelatin but also acid-treated gelatin and enzymetreated gelatin. Hydrolysis products or enzymatic decomposition products of gelatin can also be employed.

In the formation of silver halide grains in the silver halide emulsion, ammonia, an organic thioether derivative (see: Japanese Patent Publication No. 47(1972)-386) or sulfur-containing compound (see: Japanese Patent Provisional Publication No. 53(1987)-144319) can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. For the chemical sensitization of the emulsion employable for the light-sensitive material, there can be employed sulfur sensitization, reduction sensitization or noble metal sensitization, etc, singly or in combination. Those chemical sensitization processes can be carried out in the presence of a nitrogen-containing heterocyclic compound as described in Japanese Patent Provisional Publications Nos. 58(1983)-126526 and 58(1983)-215644.

When a sensitizing dye is added to the silver halide emulsion, the sensitizing dye is preferably added in the stage of preparation of the emulsion as described in the above-mentioned Japanese Patent Provisional Publication Nos. 62(1987)-947 and 62(1987)-210449. When the nitrogen-containing heterocyclic compound functioning as an anti-fogging agent and/or a development accelerator is added to the silver halide emulsion, the compound is preferably added in the stage of the formation or ripening of the silver halide grains. The process for the preparation of the light-sensitive material employing the nitrogen-containing heterocyclic compound is described in Japanese Patent Provisional Publication No. 62(1987)-161144.

When the organic silver salt is contained in the light-sensitive layer, the emulsion of the organic silver salt can be prepared in a similar manner to that in the preparation of the silver halide emulsion.

In the preparation of the light-sensitive material, the polymerizable compound can be used as a medium for the preparation of a liquid composition containing other components of the light-sensitive layer. For example, the silver halide (including silver halide emulsion), reducing agent (including the hydrazine derivative functioning as the reducing agent), color image-forming substance, and the like can be dissolved or emulsified in the polymerizable compound. Especially when the color image-forming substance is used, the substance is preferably introduced into the polymerizable compound. Further, when the oily droplets of the polymerizable compound are made in the form of microcapsules, components of the shell material may be contained in the polymerizable compound.

A copolymer consisting of hydrophilic repeating unit and hydrophobic repeating unit is preferably dissolved in the polymerizable compound employed in the preparation of the light-sensitive composition, as described in Japanese Patent Provisional Publication No. 62(1987)-209449.

The light-sensitive composition can be also prepared by dispersing microcapsules containing silver halide emulsion as a core material in the polymerizable compound instead of employing the above copolymer, as described in Japanese Patent Provisional Publication No. 62(1987)-164041 and Japanese Patent application No. 62(1987)-123190.

The emulsion of the polymerizable compound (including a microcapsule dispersion obtained by the above-mentioned process) can be employed per se as a coating solution for preparing a light-sensitive material. To the coating solution can be added other optional components as in the case of adding to the above-mentioned emulsion.

The coating solution prepared as above is coated over a support, and the coated layer of the solution is dried to prepare a light-sensitive material. Coating of the solution over the support can be easily performed by known processes.

Use of the light-sensitive material of the present invention is described below.

The image-forming method (namely use of the light-sensitive material) comprises imagewise exposing to light the light-sensitive material and developing the light-sensitive material to form a polymer image.

Various exposure means can be employed in the image-wise exposure, and in general, a latent image of the silver halide is obtained by imagewise exposure to radiation including visible light. The kind of light source or the amount of light employed in the exposure can be selected depending on the light-sensitive wavelength determined by spectral sensitization or sensitivity of silver halide. An original image can be either monochromatic image or color image.

Development of the light-sensitive material can be conducted simultaneously with or after the imagewise exposure. The development can be conducted using a developing solution in the same manner as the image-forming method described in Japanese Patent Publication No. 45(1970)-11149. The image-forming method described in Japanese Patent Provisional Publication No. 61(1986)-69062 which employs a heat development process has an advantage of simple procedures and short processing time. Therefore, the latter method is preferred as the development process of the light-sensitive material.

Heating in the heat development process can be conducted in various known manners. A heating layer which is arranged on the light-sensitive material can be used as the heating means, as described in the aforementioned Japanese Patent Provisional Publication No. 61(1986)-294434. The heat development process can be conducted under restraining the amount of oxygen in the light-sensitive layer, as described in Japanese Patent Provisional Publication No. 62(1987)-210461. Heating temperature for the development process usually ranges from 50° C. to 200° C., preferably from 60° C. to 150° C. The heating time is usually not shorter than 1 second, preferably from 1 second to 5 minutes, more preferably from 1 second to 1 minute. The development process may be conducted by heating at a temperature of not lower than 50° C. under the condition that the light-sensitive layer contains a liquid (preferably water) in an amount of 10 to 400 wt. % of the polymerizable compound, as in the image-forming method described in the specification filed in Jan. 9, 1989.

The development process can be carried out simultaneously with or after adding the aforementioned base or base precursor instead of incorporating the base or the base precursor into the light-sensitive material. For introducing the base or the base precursor into the light-sensitive layer, there is known a method of using a sheet containing the base or the base precursor (i.e., base sheet). The method of using the base sheet is most easy and preferred. The image-forming method using the base sheet is described in Japanese Patent Provisional Publication No. 63(1988)-32546.

The light-sensitive material is subjected to the heat development process as described above to polymerize the polymerizable compound within the area where a latent image of the silver halide has been formed or the area where a latent image of the silver halide has not been formed. Generally, the polymerizable compound is polymerized within the area where a latent image of the silver halide has been formed in the heat development process. However, the polymerizable compound within the area where a latent image of the silver halide has not been formed can be also polymerized by adjusting the kind or the amount of the reducing agent as described in Japanese Patent Provisional Publication No. 62(1987)-70836.

In the above-mentioned development process, a polymer image can be formed on the light-sensitive layer. A color image can be also obtained by fixing a dye or pigment on the polymer image.

As described in Japanese Patent Provisional Publication No. 62(1987)-209444, a color image can be formed on the light-sensitive material using two kinds of substances which form a color when brought into contact with each other. In this method, one of the substances is contained in microcapsules dispersed in the light-sensitive layer and the other is arranged outside of the microcapsules, and the light-sensitive material having been subjected to the development process is pressed to rupture the microcapsules so as to bring into contact the two kinds of substances with each other.

An image-receiving material can be employed to form a polymer image.

The image-receiving material employable in the image-forming method is described below. The image-forming method using the image-receiving material or an image-receiving layer is described in Japanese Patent Provisional Publication No. 61(1986)-278849.

As the support of the image-receiving material, there can be employed a baryta paper in addition to various materials employable as the support of the light-sensitive material. In the case that a porous material such as paper is employed as the support of the image-receiving material, the porous support preferably has a certain smoothness as described in Japanese Patent Provisional Publication No. 62(1987)-209530. An image-receiving material employing a transparent support is described in Japanese Patent Publication No. 62(1987)-209531.

The image-receiving material is usually prepared by providing an image-receiving layer on the support. The image-receiving layer can be constructed using a variety of compounds according to the color formation system. In the cases that a polymer image is formed on the image-receiving material and that a dye or pigment is employed as the color image forming substance, the image-receiving material can be composed of the support only.

For example, when a color formation system using a color former and a developer is employed, the developer can be contained in the image-receiving layer. Otherwise, the image-receiving layer can be composed of at least one layer containing a mordant. The mordant can be selected from various compounds which are known in the art of the conventional photography in consideration of the nature of the color image forming substance. If desired, the image-receiving layer can be composed of two or more layers containing a plurality of mordants different from each other in the mordanting power.

The image-receiving layer preferably contains a polymer as a binder. The binder which is employable for the aforementioned light-sensitive layer can be also employed for the image-receiving layer. Further, a polymer having a lower transmission coefficient of oxygen can be used as the binder, as described in Japanese Patent Provisional Publication No. 62(1987)-209454.

The image-receiving layer can contain a thermoplastic compound. In the case that the thermoplastic compound is contained in the image-receiving layer, the image-receiving layer itself is preferably composed of an agglomerate of fine particles of the thermoplastic compound (i.e., granulated thermoplastic compound). The image-receiving layer having the above constitution has such advantages that the formation of a transferred image can be readily done and a glossy image can be obtained under heating after the image formation. There is no specific limitation on the thermoplastic compounds, and a variety of thermoplastic compounds such as conventional thermoplastic resins (plastics) and waxes can be employed. However, the glass transition point of the thermoplastic resin or the melting point of the wax preferably is not higher than 200° C. The image-receiving material having an image-receiving layer containing the granular thermoplastic compound is described in Japanese Patent Provisional Publication No. 62(1987)-280071 and No. 62(1987)-280739.

A photopolymerization initiator or a thermal polymerization initiator may be contained in the image-receiving layer. In the image-formation process using an image-receiving material, a color image-forming substance is transferred together with the unpolymerized polymerizable compound as described hereinafter, so that the photopolymerization initiator or thermal polymerization initiator can be contained in the image-receiving layer to smoothly perform the curing procedure (fixing procedure) of the unpolymerized polymerizable compound. The image-receiving material having the image-receiving layer containing a photopolymerization initiator is described in Japanese Patent Provisional Publication No. 62(1987)-161149. The image-receiving layer containing a thermal polymerization initiator is described in Japanese Patent Provisional Publication No. 62(1987)-210444.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer. A layer composed of an agglomerate of a granulated thermoplastic compound can be also provided on the surface of the image-receiving layer as described in Japanese Patent Provisional Publication No. 62(1987)-210460.

In the case of using the image-receiving material, the light-sensitive material is subjected to the aforementioned development process, then pressed on the image-receiving material to transfer the unpolymerized polymerizable compound to the image-receiving material, whereby a polymer image can be formed on the image-receiving material. For applying a pressure on the light-sensitive material, various known methods can be employed.

In the case that the light-sensitive layer contains a color image-forming substance, the light-sensitive material is subjected to the heat development process to cure the polymerizable compound, and thereby the color image-forming substance in the cured portion is fixed. Then, the light-sensitive material is pressed on the image-receiving material to transfer the color image-forming substance in the uncured portion to the image-receiving material. Thus, a color image is formed on the image-receiving material.

After the image is formed on the image-receiving material, the image-receiving material can be heated to polymerize the transferred unpolymerized polymerizable compound as described in Japanese Patent Provisional Publication No. 62(1987)-210459. Through the above-mentioned process, the obtained image can be improved in the preservability.

Various image recording apparatus suitable for conducting the image-forming method using the light-sensitive material are known, and they are described for example in Japanese Patent Provisional Publication No. 62(1987)-147461.

The light-sensitive material of the invention can be used for monochromatic or color photography, printing, radiography, medical diagnosis (e.g., CRT photography of diagnostic device using ultrasonic wave), copy (e.g., computer-graphic hard copy), etc.

The present invention is further described by the following examples (including cases of using a base precursor or cases of not using a base precursor) without limiting the invention.

EXAMPLE 1

Preparation of Light-sensitive Material

Preparation of Silver Halide Emulsion (A-1)

In 1,200 ml of water were dissolved 25 g of gelatin and 1.2 g of sodium chloride, and the resulting gelatin solution was adjusted to pH 3.2 using 1N-sulfuric acid and was kept at 60° C. To the gelatin solution, 800 ml of aqueous solution containing 117 g of potassium bromide and 600 ml of aqueous solution containing 125 g of silver nitrate were added simultaneously at the same feed rate over 15 minutes. After 2 minutes, to the resulting mixture was added 5 ml of 0.1% aqueous solution of sodium thiosulfate to chemically sensitize the mixture at 60° C. for 15 minutes. Then, to the mixture was further added 50 ml of 1% methanol solution of the following sensitizing dye (1). After 14 minutes, to the resulting mixture was added 400 ml of aqueous solution containing 8.6 g of potassium iodide over 5 minutes, and the mixture was stirred for 5 minutes at 60° C. To the resulting emulsion were then added 12 ml of 10% aqueous solution of polyisobutylene/monosodium maleate copolymer and 15 ml of 10% aqueous solution of phosphoric acid to precipitate silver iodobromide grains. Then, the emulsion was washed with water for desalting repeatedly. Thus, a silver iodobromide emulsion (A-1) (blue-sensitive, yield: 460 g) having an average grain size of the silver iodobromide of 0.2 μm was obtained.

(Sensitizing dye (1))

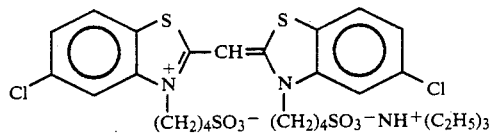

Preparation of Silver Halide Emulsion (A-2)

The procedure for preparing the silver halide emulsion (A-1) was repeated except for using 94 ml of 0.5% methanol solution of the following sensitizing dye (2) instead of 50 ml of 1% methanol solution of the sensitizing dye (1), to obtain a silver iodobromide emulsion (A-2) (green-sensitive, yield: 460 g) having an average grain size of the silver iodobromide of 0.13 μm.

(Sensitizing dye (2))

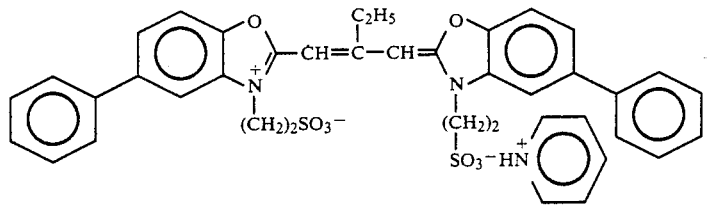

Preparation of Silver Halide Emulsion (A-3)

The procedure for preparing the silver halide emulsion (A-1) was repeated except for using 50 ml of 1% methanol solution of the following sensitizing dye (3) and 47 ml of 0.5% methanol solution of the following sensitizing dye (4) instead of the 50 ml of 1% methanol solution of the sensitizing dye (1), to obtain a silver iodobromide emulsion (A-3) (red-sensitive, yield: 460 g) having an average grain size of the silver iodobromide of 0.11 μm.

(Sensitizing dye (3))

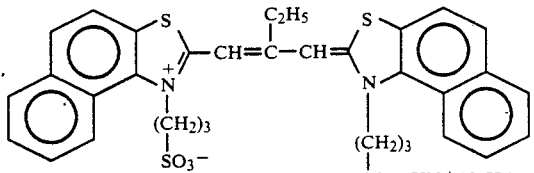

(Sensitizing dye (4))

-continued

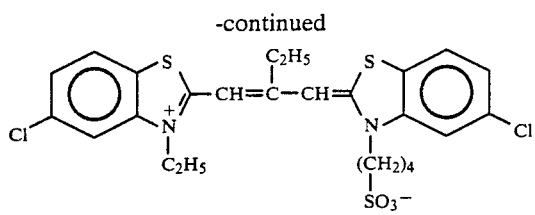

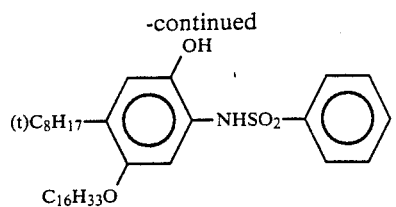

Preparation of Light-sensitive Composition (A-1)

In 100 g of the following polymerizable compound (tradename: Kayarad R-604, available from Nippon Kayaku Co., Ltd.) were dissolved 0.8 g of the following copolymer and 15 g of the following yellow color image-forming substance.

To the oily solution was then added 4.5 g of the above-obtained silver halide emulsion (A-1), and the resulting mixture was stirred at 15,000 r.p.m. for 5 minutes at 40° C. using a homogenizer to obtain a light-sensitive (blue-sensitive) composition (A-1) in the form of a W/O emulsion.

Preparation of Light-Sensitive Composition (A-2)

(Polymerizable compound)
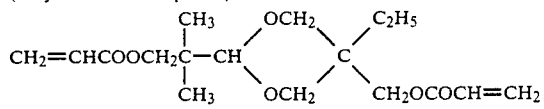

(Copolymer)
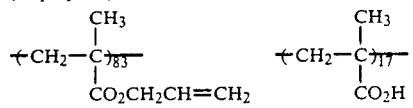

(Yellow color image-forming substance)
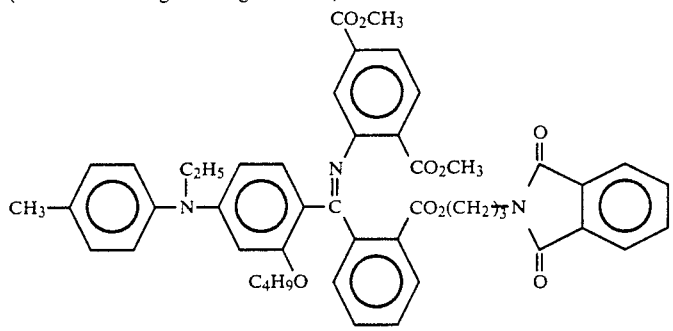

Then, in 54.0 g of the resulting solution were dissolved 0.009 g of the following development accelerator, 2.32 g of the following reducing agent (I) and 3.66 g of the following reducing agent (II) to prepare an oily solution.

(Development accelerator (I))
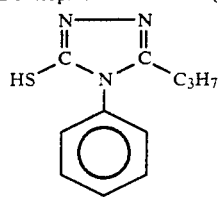

(Reducing agent (I))

(Reducing agent (II))
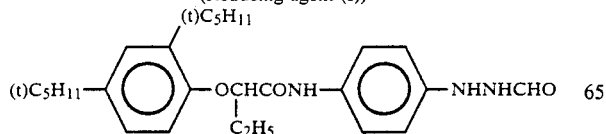

The procedure for preparing the light-sensitive composition (A-1) was repeated except for using the above-obtained silver halide emulsion (A-2) instead of the silver halide emulsion (A-1) in the same amount and using the following magenta color image-forming substance instead of the yellow color image-forming substance in the same amount, to obtain a light-sensitive (green-sensitive) composition (A-2).

(Magenta color image-forming substance)
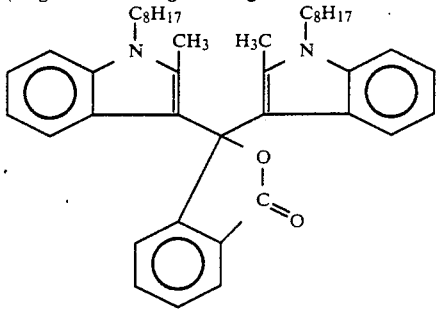

Preparation of Light-Sensitive Composition (A-3)

The procedure for preparing the light-sensitive composition (A-1) was repeated except for using the above-obtained silver halide emulsion (A-3) instead of the silver halide emulsion (A-1) in the same amount and using the following cyan color image-forming substance instead of the yellow color image-forming substance instead of the yellow color image-forming substance in the same amount, to obtain a light-sensitive composition (A-3).

(Cyan color image-forming substance)

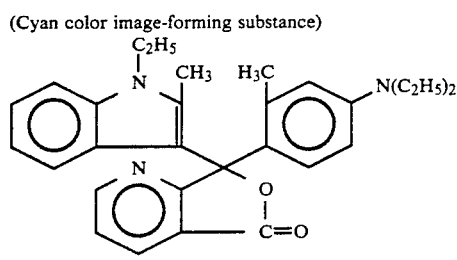

Preparation of Light-Sensitive Microcapsule Dispersion (A-1)

124.8 g of 10% aqueous solution of sodium polyvinylbenzenesulfonate (tradename: VERSA TL-502, available from National Starch, Co.) and 7.66 g of 15% aqueous solution of the following potassium polyvinylbenzenesulfinate (P-2) were mixed with each other, and the mixture was adjusted to pH 5.0. 132.5 g of the obtained mixture was added to the above-prepared light-sensitive composition (A-1), and the resulting mixture was heated to 40° C. and stirred at 3,000 r.p.m. for 20 minutes using a homogenizer to obtain a W/O/W emulsion.

Independently, to 63.3 g of melamine were added 85.5 g of 37% aqueous solution of formaldehyde and 325.9 g of distilled water, and the resulting mixture was stirred at 60° C. for 40 minutes to obtain a transparent aqueous solution of melamine-formaldehyde precondensate.

77.1 g of the aqueous solution of the precondensate was added to the above-prepared W/O/W emulsion, and the resulting mixture was adjusted to pH 5.5 using 20% aqueous solution of phosphoric acid. The mixture was then heated to 60° C. and stirred for 90 minutes.

Further, to the mixture was added 16.2 g of 40% aqueous solution of urea to remove formaldehyde remaining in the microcapsule dispersion, and the mixture was adjusted to pH 3.5 using 20% aqueous solution of phosphoric acid. The mixture was then heated to 60° C. and stirred for 40 minutes. Finally, the mixture was cooled to room temperature, and was adjusted to pH 6.5 using 10% aqueous solution of sodium hydroxide. Thus, a light-sensitive (blue-sensitive) microcapsule dispersion (A-1) containing microcapsules having a melamine-formaldehyde resin shell was obtained.

Preparation of Light-Sensitive Microcapsule Dispersion (A-2)

The procedure for preparing the light-sensitive microcapsule dispersion (A-1) was repeated except for using the light-sensitive composition (A-2) instead of the light-sensitive composition (A-1), to prepare a light-sensitive (green-sensitive) microcapsule dispersion (A-2).

Preparation of Light-Sensitive Microcapsule Dispersion (A-3)

The procedure for preparing the light-sensitive microcapsule dispersion (A-1) was repeated except for using the light-sensitive composition (A-3) instead of the light-sensitive composition (A-1), to prepare a light-sensitive (red-sensitive) microcapsule dispersion (A-3).

Preparation of Zinc Compound Dispersion 16 g of basic zinc carbonate ($Zn(OH)_2$) was dispersed in 84 g of 4% aqueous solution of gelatin using Dynomill dispersing device at 20° C. until the average particle diameter of the zinc carbonate became not larger than 2 μm. Thus, a zinc compound dispersion was prepared.

Preparation of Light-Sensitive Material (A)

11.4 g of the light-sensitive microcapsule dispersion (A-1), 11.4 g of the light-sensitive microcapsule dispersion (A-2), 11.4 g of the light-sensitive microcapsule dispersion (A-3), 2.8 g of the zinc compound dispersion, 3.1 g of 10% aqueous solution of gelatin, 4.0 g of 5% aqueous solution of the following surface active agent, 29.4 g of distilled water and 0.5 g of 2% methanol solution of the following gelatin hardener were mixed with each other to prepare a coating solution.

The coating solution was coated on a polyethylene terephthalate film in an amount of 53 ml/m², and the coated layer of the solution was dried at 40° C. for 1 hour. Further, the film with the coated layer was stored for 12 hours at a high temperature (40° C.) and a high humidity (70%) to prepare a light-sensitive material (A) of the present invention.

(Surface active agent)

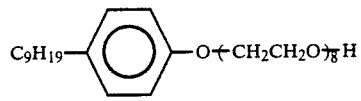

(Gelatin hardener)
$CH_2=CHSO_2CH_2CONH(CH_2)_3NHCOCH_2SO_2CH=CH_2$

COMPARISON EXAMPLE 1

Preparation of Light-Sensitive Microcapsule Dispersion (B-1)

The procedure for preparing the light-sensitive microcapsule dispersion (A-1) in Example 1 was repeated except for not using potassium polyvinylbenznesulfinate, to prepare a light-sensitive (blue-sensitive) microcapsule dispersion (B-1).

Preparation of Light-Sensitive Microcapsule Dispersion (B-2)

The procedure for preparing the light-sensitive microcapsule dispersion (A-2) in Example 1 was repeated except for not using potassium polyvinylbenzenesulfinate, to prepare a light-sensitive (green-sensitive) microcapsule dispersion (B-2).

Preparation of Light-Sensitive Microcapsule Dispersion (B-3)

The procedure for preparing the light-sensitive microcapsule dispersion (A-3) in Example 1 was repeated except for not using potassium polyvinylbenznesulfinate, to prepare a light-sensitive (red-sensitive) microcapsule dispersion (B-3).

Preparation of Light-Sensitive Material (B)

The procedure for preparing the light-sensitive material (A) in Example 1 was repeated except for using the light-sensitive microcapsule dispersions (B-1), (B-2) and (B-3) instead of the light-sensitive microcapsule dispersions (A-1), (A-2) and (A-3), respectively, to prepare a light-sensitive material (B) for comparison.

Evaluation of Light-Sensitive Microcapsule Dispersion

Each of the light-sensitive microcapsule dispersions (A-1), (A-2), (A-3), (B-1), (B-2) and (B-3) prepared as above was evaluated for dispersibility of the microcapsules and the denseness of the shell of the microcapsules (i.e., retention of the core material in the microcapsules) according to the following tests.

(1) Dispersibility of Microcapsules

The light-sensitive microcapsules in each dispersion were measured for mean particle diameter by volume and the standard deviation using a coulter counter.

The results are set forth in Table 1.

(2) Denseness of Shell (Retention of Core Material)

To 3 g of each microcapsule dispersion were added 3 g of a coating solution for the formation of an image-receiving layer (described later) and 1.5 g of distilled water, to prepare various coating solutions each corresponding to each microcapsule dispersion. Each of the coating solutions was coated over a polyethylene terephthalate film (thickness: 100 μm) in an amount of 70 ml/m², and the coated layer of the solution was dried at 40° C. for 1 hour to obtain various samples, each corresponding to each microcapsule dispersion.

Each of the obtained samples was measured on the color image density using Macbeth reflection densitometer in the cases of not heating each sample (that is, the sample was allowed to stand at room temperature, i.e., 25° C.) and in the cases of heating each sample at 125° C. and 140° C. (that is, the sample was heated by pressing on a hot plate of the same temperatures). In these cases, the samples (A-1) and (B-1) were measured for yellow color image density, the samples (A-2) and (B-2) were measured for magenta color image density, and the samples (A-3) and (B-3) were measured for cyan color image density.

A color is given by the reaction of a color image-forming substance (lueco dye) contained in the core material of the microcapsule with a developer existing outside of the microcapsule (developer contained in the coating solution for the formation of an image-receiving layer, i.e., zinc 3,5-di-α-methylbenzylsalicylate). In the above evaluation, accordingly, a high density is given when the denseness of the shell is low, while a low density is given when the denseness of the shell is high.

The results are set forth in Table 1.

TABLE 1

| Light-sensitive Microcapsule | Mean Particle Diameter by Volume (μm) | Standard Deviation (μm) | Reflection Density | | |
|---|---|---|---|---|---|
| | | | 25° C. | 125° C. | 140° C. |
| (A-1) | 10.1 | 4.7 | 0.38 | 0.47 | 0.49 |
| (A-2) | 9.7 | 6.0 | 0.32 | 0.39 | 0.41 |
| (A-3) | 10.8 | 5.6 | 0.27 | 0.43 | 0.47 |
| (B-1) | 23.7 | 17.7 | 0.57 | 0.72 | 0.70 |
| (B-2) | 19.6 | 13.1 | 0.71 | 0.77 | 0.79 |
| (B-3) | 25.4 | 16.8 | 0.54 | 0.61 | 0.63 |

As is evident from the results set forth in Table 1, the microcapsules prepared using a water-soluble polymer having a sulfinyl group had a satisfactory mean particle diameter by volume of approx. 10 μm, and had a narrow particle size distribution (that is, standard deviation of the particle diameter was small). Further, the reflection density of the samples according to the invention measured by Macbeth reflection densitometer was relatively low, whether or not the samples were heated (at 125° C. and 140° C.) or not heated (allowed to stand at room temperature), so that it was confirmed that the microcapsules according to the invention had a high shell density.

On the contrary, the microcapsules for comparison prepared not using a water-soluble polymer having a sulfinyl group had a large mean particle diameter by volume of 20 μm, and the denseness of the shell was relatively low.

Evaluation of Light-Sensitive Material

Preparation of Treating Material 6 g of guanidine picolinate was dissolved in 20 g of 10% aqueous solution of gelatin, and to the resulting solution were added 10 ml of 4% aqueous solution of 2,4-dichloro-6-hydroxy-1,3,5-triazine and water, to obtain 50 g of a coating solution. The coating solution was coated over a polyethylene terephthalate film (thickness: 50 μm) in an amount of 30 g/m², and the coated solution was dried to obtain a treating material.

Preparation of Image-receiving Material (1)

To 125 g of water was added 11 g of 40% aqueous solution of sodium hexametaphosphate, and to the mixture were further added 34 g of zinc 3,5-di-α-methylbenzigalicylate and 82 g of 55% slurry of calcium carbonate, followed by coarsely dispersing in a mixer. The resulting coarse dispersion was then finely dispersed in a Dynomill dispersing device. To 200 g of the resulting dispersion was added 112 g of 8% aqueous solution of polyvinyl alcohol, and the resulting mixture was made uniform. To the mixture was further added 70 ml of water to give a coating solution for the formation of an image-receiving layer. The coating solution was evenly coated on a paper support having a basis weight of 55 g/m² in an amount of 58 g/m². The paper support was prepared from a paper sheet having such a fiber length distribution that the total of 24-mesh residue (wt. %) and 42-mesh residue (wt. %) is in the range of 30 to 60 wt. % as the fiber length distribution based on JIS-P-8207.

The coated layer of the solution was then dried at 60° C. to prepare an image-receiving material (1).

The light-sensitive materials obtained in Example 1 and Comparison Example 1 were evaluated according to the following test.

Each of the light-sensitive materials was imagewise exposed to light at 2,000 lux for 1 second using a halogen lamp over a continuous filter having a transmission density of 0-3.0. Then, over the light-sensitive material was coated (or sprayed) water in an amount of 6 g/m² and then superposed on the above-obtained treating material. The light-sensitive material with the treating material was subjected to heat development at 100° C. for periods of 7 seconds and 15 seconds. Thereafter, the light-sensitive material was separated from the treating material, and the light-sensitive material was then superposed on the above-obtained image-receiving material (1). The light-sensitive material with the image-receiving material was passed through press rollers under pressure of 500 kg/cm² to obtain an image on the image-receiving material. The image obtained on the image-receiving material was measured on the density using Macbeth reflection densitometer.

Further, unevenness of the reflection density of the image obtained on each image-receiving material (i.e., unevenness of image density) was observed through eye-measurement with respect to the reflection density region of 0.3 to 0.7, that is, the uncolored portion having a diameter of not larger than 1 mm within the intermediate density region was observed.

The results are set forth in Table 2.

TABLE 2

| Light-sensitive Material | Heating Time (Seconds) | Maximum Density | Minimum Density | Unevenness of Image Density |
|---|---|---|---|---|
| (A) | 7 | 1.18 | 0.11 | hardly observed |
|  | 15 | 1.17 | 0.10 | hardly observed |
| (B) | 7 | 1.14 | 0.36 | many observed |
|  | 15 | 0.91 | 0.33 | many observed |

As is evident from the results set forth in Table 2, the light-sensitive material (A) of the invention gave an image of high contrast having high maximum density and low minimum density, even if the heating time (developing time) was prolonged. In the light-sensitive material (B) for comparison, however, the minimum density of the image was not lowered satisfactorily even when the heating time was prolonged and the maximum density lowered, that is, the obtained image is decreased in the contrast with the heating time.

Further, the light-sensitive material (A) of the invention gave an even and smooth image, but the light-sensitive material (B) for comparison gave an image of unevenness having a number of small sized uncolored portions.

EXAMPLE 2

Preparation of Light-Sensitive Material

Preparation of Silver Halide Emulsion (C)

In 1,200 ml of water were dissolved 24 g of gelatin and 1.2 g of sodium chloride, and the resulting gelatin solution was adjusted to pH 3.2 using 1N-sulfuric acid and was kept at 60° C. To the gelatin solution, 600 ml of aqueous solution containing 117 g of potassium bromide and 600 ml of aqueous solution containing 0.74 mole of silver nitrate were added simultaneously at the same feed rate over 15 minutes. After 1 minute, to the resulting mixture was added 47 ml of 1% methanol solution of the sensitizing dye (2) used in Example 1. After 15 minutes, to the mixture was further added 200 ml of aqueous solution containing 4.3 g of potassium iodide in the same feed rate over 5 minutes. To the resulting emulsion was then added 1.2 g of polyisobutylene/monosodium maleate copolymer.

After the emulsion was washed with water for desalting, 24 g of gelatin was added to the emulsion. Further, to the resulting emulsion was added 5 mg of sodium thiosulfate to chemically sensitize the emulsion at 60° C. for 15 minutes. Thus, a silver halide emulsion (C) (green-sensitive, yield: 1,000 g) was obtained.

Preparation of Light-Sensitive Composition (C)

In 100 g of the polymerizable compound used in Example 1 were dissolved 0.80 g of the copolymer used in Example 1, 20.0 g of Pargascript Red I-6-B (tradename of Ciba-Geigy). In the resulting solution was dispersed 15 g of the following base precursor (1) using a Dynomill dispersing device. Then, to the resulting dispersion were successively added 1.29 g of the reducing agent (I) used in Example 1, 1.22 g of the reducing agent (II) also used in Example 1, 0.001 g of the following development accelerator (2) and 4.0 g of methylene chloride, to prepare a homogeneous oily solution.

(Base precursor (1))

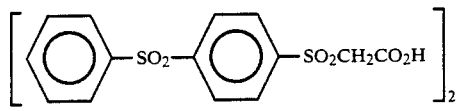

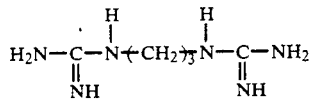

(Development accelerator (2))

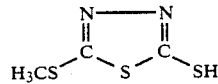

Separately, to 3.0 g of the above-prepared silver halide emulsion (C) was added 0.46 ml of 10% aqueous solution of potassium bromide, and the mixture was stirred for 5 minutes to prepare an aqueous mixture.

The mixture was then added to the above-obtained homogeneous oily solution, and the resulting mixture was stirred at 15,000 r.p.m. for 5 minutes using a homogenizer to obtain a light-sensitive composition (C) in the form of a W/O emulsion.

Preparation of Light-Sensitive Microcapsule Dispersion (C)

A mixture of 2.8 g of 15% aqueous solution of potassium polyvinylbenzenesulfinate (P-2) used in Example 1 and 45.5 g of 5% aqueous solution of polyvinyl pyrrolidone (tradename: K-90, available from Wako Junyaku Industry Ltd.) was adjusted to pH 5.0. To the mixture was added the light-sensitive composition (C), and the resulting mixture was stirred at 9,000 r.p.m. at 40° C. for 30 minutes using a homogenizer to obtain a W/O/W emulsion.

Independently, to 23.0 g of melamine were added 38.0 g of 37% aqueous solution of formaldehyde and 124.0 g of distilled water, and the resulting mixture was heated to 60° C. and stirred for 30 minutes to obtain a transparent aqueous solution of melamine-formaldehyde precondensate.

20.0 g of the aqueous solution of the precondensate was added to the above-prepared W/O/W emulsion, and the resulting mixture was adjusted to pH 5.5 using a 20% aqueous solution of phosphoric acid. The mixture was then heated to 60° C. and stirred for 120 minutes. Further, the mixture was adjusted to pH 6.5 using 1N-aqueous solution of sodium hydroxide, to obtain a light-sensitive microcapsule dispersion (C) containing microcapsules having a melamine-formaldehyde resin shell.

Preparation of Light-Sensitive Material (C)

To 2.50 g of the above-prepared light-sensitive microcapsule dispersion (C) were added 0.33 g of 5% aqueous solution of Emalex NP-8 (tradename of Nippon Emulsion Co., Ltd.), 0.83 g of 20% aqueous dispersion of cornstarch and 3.19 g of distilled water, and the resulting mixture was well stirred to obtain a coating solution for the formation of a light-sensitive layer.

The coating solution was coated over a polyethylene terephthalate film (thickness: 100 μm) using a wire bar of #40, and the coated layer of the solution was dried at 40° C. for 1 hour to prepare a light-sensitive material (C) of the present invention.

EXAMPLE 3

Preparation of Light-Sensitive Material (D)

The procedure of Example 2 were repeated except for varying the amount of the base precursor (1) to 8.0 g, to prepare a light-sensitive material (D) of the present invention.

EXAMPLE 4

Preparation of Light-Sensitive Material (E)

The procedures of Example 2 were repeated except for using the following base precursor (2) instead of the base precursor (1), to prepare a light-sensitive material (E) of the present invention.

(Base precursor (2))

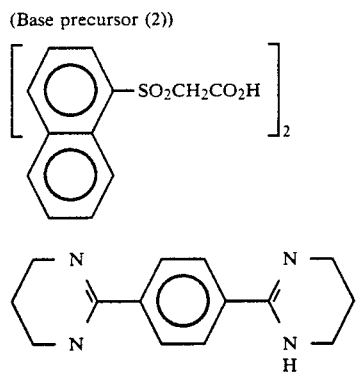

EXAMPLE 5

Preparation of Light-Sensitive Material (F)

The procedures of Example 4 were repeated except for varying the amount of the base precursor (2) to 8.0 g, to prepare a light-sensitive material (F) of the present invention.

COMPARISON EXAMPLE 2

Preparation of Light-Sensitive Microcapsule Dispersion (G)

The procedure for preparing the light-sensitive microcapsule dispersion (C) in Example 2 was repeated except for using 46.3 g of 10% aqueous solution of sodium polyvinylbenzenesulfonate (tradename: VERSA TL-502, available from National Starch Co.) having been adjusted to pH 6.0 instead of the protective colloid and varying pH value of the emulsion obtained by adding the melamine-formaldehyde precondensate to 5.5, to prepare a light-sensitive microcapsule dispersion (G).

Preparation of Light-Sensitive Material (G)

The procedure for preparing the light-sensitive material (C) in Example 2 was repeated except for using the above-prepared light-sensitive microcapsule dispersion (G) instead of the light-sensitive microcapsule dispersion (C), to prepare a light-sensitive material (G) for comparison.

COMPARISON EXAMPLE 3

Preparation of Light-Sensitive Material (H)

The procedures of Comparison Example 2 were repeated except for varying the amount of the base precursor (1) to 8.0 g, to prepare a light-sensitive material (H) for comparison.

COMPARISON EXAMPLE 4

Preparation of Light-Sensitive Material (I)

The procedures of Comparison Example 2 were repeated except for using the base precursor (2) used in Example 4 instead of the base precursor (1), to prepare a light-sensitive material (I) for comparison.

COMPARISON EXAMPLE 5

Preparation of Light-Sensitive Material (J)

The procedures of Comparison Example 4 were repeated except for varying the amount of the base precursor (2) to 8.0 g, to prepare a light-sensitive material (J) for comparison.

Evaluation of Light-Sensitive Material

Preparation of Image-Receiving Material

To 125 g of water was added 11 g of 40% aqueous solution of sodium hexametaphosphate, and to the mixture were further added 34 g of zinc 3,5-di-α-methylbenzylsalicylate and 82 g of 55% slurry of calcium carbonate, followed by coarsely dispersing in a mixer. The resulting coarse dispersion was then finely dispersed in a Dynomill dispersing device. To 200 g of the resulting dispersion were added 6 g of 50% latex of SBR and 55 g of 8% aqueous solution of polyvinyl alcohol, and the resulting mixture was made uniform to give a coating solution for the formation of an image-receiving layer. The coating solution was evenly coated on a baryta paper having basis weight of 43 g/m² to give a coated layer having wet thickness of 30 μm. The coated layer was then dried to prepare an image-receiving material (2).

The light-sensitive materials obtained in Examples 2 to 5 and Comparison Examples 2 to 5 were evaluated according to the following test using the above-obtained image-receiving material (2).

Each of the light-sensitive materials was imagewise exposed to light at 2,000 lux for 1 second using a halogen lamp over a continuous filter having a transmission density of 0–3.0, and the light-sensitive material was then heated on a hot plate of 140° C. for periods of 5, 10 and 15 seconds.

Each of the light-sensitive materials was then superposed on the image-receiving material and they were passed through press rollers under pressure of 500 kg/cm² to obtain a magenta positive image on the image-receiving material. The magenta positive image on the image receiving material was measured on the minimum density using Macbeth reflection densitometer.

The results are set forth in Table 3.

TABLE 3

| Light-sensitive Material | Protective Colloid (Water-soluble Polymer) | Base Precursor Kind | Amount (g) | Minimum Density (Seconds) | | |
|---|---|---|---|---|---|---|
| | | | | 5 | 10 | 15 |
| (C) | (P-2) & PVP | (1) | 15 | 0.42 | 0.10 | 0.08 |
| (D) | " | (1) | 8 | 0.59 | 0.18 | 0.10 |
| (E) | " | (2) | 15 | 0.47 | 0.14 | 0.08 |
| (F) | " | (2) | 8 | 0.65 | 0.23 | 0.12 |
| (G) | Sodium Polyvinylbenzenesulfonate | (1) | 15 | 0.87 | 0.35 | 0.22 |
| (H) | Sodium Polyvinylbenzenesulfonate | (1) | 8 | 1.11 | 0.99 | 0.73 |
| (I) | Sodium Polyvinylbenzenesulfonate | (2) | 15 | 0.89 | 0.46 | 0.34 |
| (J) | Sodium Polyvinylbenzenesulfonate | (2) | 8 | 1.13 | 0.94 | 0.75 |

As is evident from the results set forth in Table 3, the base precursor was not eluted out of the microcapsules and was firmly kept within the microcapsules in the preparation of the microcapsules by using both of the water-soluble polymer having a sulfinyl group and the protective colloid containing a nonionic polymer. Further, the light-sensitive materials (C) to (F) of the present invention containing thus prepared microcapsules were developed more rapidly with use of only a small amount of a base precursor as compared with the light-sensitive materials for comparison containing microcapsules prepared using an anionic polymer, because the base precursor hardly oozed out of the microcapsules in the developing procedure.

It was also confirmed that the light-sensitive materials (C) to (F) of the invention gave images of high evenness and high smoothness.

We claim:

1. A light-sensitive material comprising a support and a light-sensitive layer provided thereon which contains silver halide, a reducing agent and an ethylenically unsaturated polymerizable compound, said silver halide and said polymerizable compound being contained in oily droplets which are a core material of microcapsules;
   wherein the oily droplet has a film therearound which is composed of a reaction product of a water soluble polymer having a sulfinyl group with an ethylenically unsaturated polymerizable compound, and the microcapsule has a shell of an amino-aldehyde resin on the inner side or outer side of the film.

2. The light-sensitive material as claimed in claim 1, wherein the water-soluble polymer having a sulfinyl group has the formula (I):

in which A is a repeated unit derived from an ethylenically unsaturated monomer having a sulfinyl group; B is a repeated unit derived from an ethylenically unsaturated monomer not having a sulfinyl group; x is in the range of 0.1 to 100 mol %; y is in the range of 0 to 99.9 mol %.

3. The light-sensitive material as claimed in claim 1, wherein the water-soluble polymer having a sulfinyl group has the formula (I):

in which A is a repeated unit derived from a monomer selected from the group consisting of sodium vinylbenzenesulfinate, potassium vinylbenzenesulfinate and ammonium vinylbenzenesulfinate; B is a repeated unit derived from an ethylenically unsaturated monomer not having a sulfinyl group; x is in the range of 0.1 to 100 mol %; y is in the range of 0 to 99.9 mol %.

4. The light-sensitive material as claimed in claim 1, wherein the amount of the sulfinyl group contained in the water-soluble polymer having a sulfinyl group is in the range of 0.1 to 100 mol % based on the amount of the ethylenically unsaturated group contained in the ethylenically unsaturated polymerizable compound.

5. The light-sensitive material as claimed in claim 1, wherein the reducing agent is contained in the core material.

6. The light-sensitive material as claimed in claim 1, wherein the light-sensitive layer further contains a base precursor and the base precursor is contained in the core material.

7. The light-sensitive material as claimed in claim 1, wherein the light-sensitive layer further contains a base precursor, said base precursor being contained in the core material and being in the form of a salt of an organic base with a carboxylic acid, said organic base being a diacidic to tetraacidic base which is composed of two to four amidine moieties and a liking group for the amidine moieties, said amidine moiety corresponding to an atomic group formed by removing one or two hydrogen atoms from an amidine having the following formula (1):

in which each of $R^{11}$, $R^{12}$, $R^{13}$ and $R^{14}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent groups, and any two of $R^{11}$, $R^{12}$, $R^{13}$ and $R^{14}$ may be combined together to form a five-membered or six-membered heterocyclic ring consisting of nitrogen and carbon atoms.

8. The light-sensitive material as claimed in claim 1, wherein the light-sensitive layer further contains a base precursor, said base precursor being contained in the core material and being in the form of a salt of an organic base with a carboxylic acid, said organic base being a diacidic to tetraacidic base which is composed of two to four guanidine moieties and a liking group for the guanidine moieties, said guanidine moiety corresponding to an atomic group formed by removing one or two hydrogen atoms from a guanidine having the following formula (2):

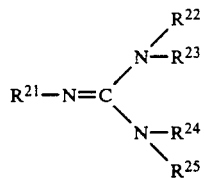 (2)

in which each of $R^{21}$, $R^{22}$, $R^{23}$, $R^{24}$ and $R^{25}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent groups, and any two of $R^{21}$, $R^{22}$, $R^{23}$, $R^{24}$ and $R^{25}$ may be combined together to form a five-membered or six-membered heterocyclic ring consisting of nitrogen and carbon atoms.

9. The light-sensitive material as claimed in claim 1, wherein the mean diameter of the microcapsules is in the range of 1 to 20 μm.

* * * * *